US008055492B2

(12) United States Patent
Adir

(10) Patent No.: US 8,055,492 B2
(45) Date of Patent: Nov. 8, 2011

(54) NON-UNIQUE RESULTS IN DESIGN VERIFICATION BY TEST PROGRAMS

(75) Inventor: Allon Adir, Tivon (IL)

(73) Assignee: International Business Machines Corporation, Armonk, NY (US)

( * ) Notice: Subject to any disclaimer, the term of this patent is extended or adjusted under 35 U.S.C. 154(b) by 2371 days.

(21) Appl. No.: 10/041,671

(22) Filed: Jan. 10, 2002

(65) Prior Publication Data

US 2003/0130831 A1   Jul. 10, 2003

(51) Int. Cl.
| | |
|---|---|
| G06F 17/50 | (2006.01) |
| G06F 9/44 | (2006.01) |
| G06F 11/22 | (2006.01) |
| G06F 13/00 | (2006.01) |
| G01N 31/00 | (2006.01) |

(52) U.S. Cl. .................. 703/13; 703/1; 703/21; 703/22; 711/141; 711/144; 711/146; 712/25; 714/10; 714/21; 714/25; 714/37; 714/42; 716/106; 716/136

(58) Field of Classification Search ..................... 703/13, 703/1, 21, 22; 712/25; 711/141, 144, 146; 716/106, 136; 714/10, 21, 25, 37, 42
See application file for complete search history.

(56) References Cited

U.S. PATENT DOCUMENTS

| 5,404,553 | A | * | 4/1995 | Komori et al. ................... 712/25 |
| 5,406,504 | A | * | 4/1995 | Denisco et al. ................. 702/117 |
| 5,485,572 | A | * | 1/1996 | Overley ........................... 714/21 |
| 5,530,933 | A | * | 6/1996 | Frink et al. .................... 711/141 |
| 5,673,413 | A | * | 9/1997 | Deshpande et al. ........... 711/141 |
| 5,692,153 | A | * | 11/1997 | Malik et al. .................... 711/141 |
| 5,740,353 | A | * | 4/1998 | Kreulen et al. .................. 714/42 |
| 5,748,879 | A | * | 5/1998 | Kobayashi ....................... 714/42 |
| 5,787,477 | A | * | 7/1998 | Rechtschaffen et al. ...... 711/141 |
| 5,802,573 | A | * | 9/1998 | Lin et al. ........................ 711/144 |
| 5,815,688 | A | * | 9/1998 | Averill ........................... 716/136 |
| 5,960,457 | A | * | 9/1999 | Skrovan et al. ................ 711/146 |
| 6,021,261 | A | * | 2/2000 | Barrett et al. .................... 714/37 |
| 6,049,851 | A | * | 4/2000 | Bryg et al. ...................... 711/141 |
| 6,158,021 | A | * | 12/2000 | Ziegler et al. .................... 714/25 |
| 6,240,490 | B1 | * | 5/2001 | Lyles et al. ..................... 711/141 |
| 6,446,241 | B1 | * | 9/2002 | Mobley et al. ................. 716/106 |
| 6,892,319 | B2 | * | 5/2005 | Qadeer ............................ 714/10 |

OTHER PUBLICATIONS

Genie: Genesys-MP User's Guide. Chapters 1-4, 1999.*
Luo et al. "Development and Validation of a Hierarchical Memory Model Incorporating CPU- and Memory-Operation Overlap", ACM 1998.*
Taylor et al. "Functional Verification of a Multiple-Issue, Out-of-Order, Superscalar Alpha Processor—The DEC Alpha 21264 Microprocessor", 1998.*

(Continued)

*Primary Examiner* — Kamini S Shah
*Assistant Examiner* — Shambhavi Patel
(74) *Attorney, Agent, or Firm* — Daniel Kligler

(57) ABSTRACT

A design verification system that verifies the operation of multi-processor architecture by generating test programs in which the behavior of the processor, when executing the test program, is evaluated against the behavior required by the design specification. The test program generator produces scenarios for a multi-processor design in which non-unique results may occur. The system is provided with facilities to report expected outcomes, and to evaluate the validity of non-unique results in multiple resources under conditions of non-unique result propagation and dependencies among adjacent and non-adjacent resources.

32 Claims, 7 Drawing Sheets

OTHER PUBLICATIONS

Saha et al. "A Simulation Based Approach to Architectural Verification of Multiprocessor Systems", IEEE 1995.*

Worringen et al. "Exploiting Transparent Remote Memory Access for Non-Contiguous- and One-Sided-Communication", Oct. 2001.*

Tahar, et al. "A Practical Methodology for the Formal Verification of RISC Processors", Formal Methods in System Design 13, 159-225 (1998).*

Park et al. "An Executable Specification, Analyzer, and Verifier for RMO (Relaxed Memory Order)", Jul. 1997.*

Ghughal, Rajnish. "Test Model-Checking Approach to Verification of Formal Memory Models", Dec. 1999.*

Gharachorloo et al. Memory Consistency and Event Ordering in Scalable Shared-Memory Multiprocessors, IEEE 1990.*

Chandra et al. "AVPGEN-A Test Generator for Architecture Verification", IEEE Transactions on Very Large Scale Integration (VLSI) Systems, vol. 3, No. 2, Jun. 1995.*

Chatterjee et al. "Efficient Checker Processor Design", IEEE 2000.*

Taylor, et al. "Functional Verification of a Multiple-issue, Out-of-Order, Superscalar Alpha Processor—The DEC Alpha 21264 Microprocessor", ACM 1998.*

A. Saha et al., "A Stimulation-Based Approach to Architectural Verification of Multiprocessor System", IEEE, 1995, pp. 34-37.

A. Chandra et al., "AVPGEN— A Test Generator for Architecture Verification", *IEEE Transactions on Very Large Scale Integration (VSLI)*, Jun. 1995, pp. 188-200, vol. 3, No. 2.

Y. Lichtenstein et al., "Model Based Test Generation for Processor Verification", *Sixth Innovative Applications of Artificial Intelligence Conference*, Aug. 1994, pp. 83-94.

B. O'Krafka et al., "MPTG: A Portable Test Generator for Cache-Coherent Multiprocessors", *IEEE*, 1995, pp. 38-44.

Genesys—MP, User's Guide, Chapter 1-4, pp. 5-53, 1999.

* cited by examiner ized on the design simulator. It operates without reference to predicted architectural results in the test
NON-UNIQUE RESULTS IN DESIGN VERIFICATION BY TEST PROGRAMS

BACKGROUND OF THE INVENTION

1. Field of the Invention

This invention relates generally to systems for verifying an architecture, and more particularly to techniques for hardware verification in multiprocessor ("MP") computer systems.

2. Description of the Related Art

An important aspect of designing an advanced computer processor is the ability to test the design of the processor thoroughly, in order to assure that the design complies with desired architectural, performance and design specifications. One known verification technique requires the generation of a large number of instruction sequences to assure that the processor behaves properly under a wide variety of circumstances.

Test program generators are basically sophisticated software engines, which are used to create numerous hard-coded test cases. By appropriate configuration, it is possible for test generation to be focused on very specific ranges of conditions, or broadened to cover a wide range of logic. Today, large numbers of test cases can be created in the time that a single test case could be written manually, as was done prior to the advent of test case generators. Modern test program generators are sophisticated enough to evaluate the microarchitectural implementation of a processor.

Typically, the input to the test program generator is a user defined sequence of partially specified instructions, known as the instruction stream, which acts as a template for the test to be generated. The instruction stream is generally incomplete, in that various details of each instruction, such as the specific source and the target resources to be used, the data values of each uninitialized resource, and even the exact instruction to be generated, may be left unspecified. The test program generator then generates a complete test by filling in the missing information with random values. The choice of random values is often biased, so as to increase the likelihood of detecting a design flaw. The use of templates in this manner allows the creation of numerous test cases that stress the implementation of the logic, creating various conditions such as "buffer full," "pipe stall".

An example of a conventional test program generator is the IBM tool, "Genesys", which is disclosed in the document *Model-Based Test Generation for Process Design Verification*, Y. Lichtenstein et. al., Sixth Innovative Applications of Artificial Intelligence Conference, August 1994, pp. 83-94.

Another conventional test program generator, AVPGEN, is disclosed in the document *AVPGEN—A Generator for Architecture Verification Test Cases*, A. Chandra, et al. IEEE Trans. Very Large Scale Integration (VLSI) Syst. 3, No. 2, 188-200 (June 1995).

Verification of multiprocessor designs present special complexities, because of race conditions that can occur in different registers and other memory stores, such that results are unpredictable and non-unique.

A test generator is disclosed in the publication B. O'Krafka, et al., "*MPTG: A Portable Test Generator for Cache-Coherent Multiprocessors*", International Conference on Computers and Communications, 1995, pp 38-44. This generator is capable of generating tests that include scenarios with unpredictable results and relies on checks carried out for intermediate points in the test. These checks are done while the test is simulated on the design simulator. It operates without reference to predicted architectural results in the test itself. This generator is limited in the types of collision scenarios that can be generated and in the types of violations that can be detected via these checks.

SUMMARY OF THE INVENTION

It is a primary advantage of some aspects of the present invention that upon completion of a test program it can be verified that resources that could contain unpredictable or non-unique values in fact contain a valid value.

It is another advantage of some aspects of the present invention that a design specification can be verified with a test in which propagation of non-unique results occurs among resources.

It is a further advantage of some aspects of the present invention that a design specification can be verified in which propagation of non-unique results occurs among resources, and dependencies exist among the resources.

It is yet another advantage of some aspects of the present invention that the occurrence and propagation of non-unique results can be accurately predicted in resources during design verification by test program generation.

A design verification system, which verifies the operation of a multi-processor architecture by generating test programs in which the behavior of the processor, when executing the test program, is evaluated against the behavior required by the design specification. The test program generator produces scenarios for a multi-processor design in which non-unique results may occur. The system is provided with facilities to report expected outcomes, and to evaluate the validity of non-unique results in multiple resources under conditions of non-unique result propagation and dependencies among adjacent and non-adjacent resources. The system is effective when interdependencies among resources in which such propagation is occurring.

The invention provides a method for validating a processor design by simulating program execution, including the steps of identifying a resource that may be accessed by a test program using a first simulated process and a second simulated process, associating a set of non-unique values for the resource, executing the test program executing a first sequence of instructions in the first simulated process, and simultaneously executing a second sequence of instructions in the second simulated process. The resource is accessed by at least one of the first and the second simulated processes. Upon completion of execution, a member of the set of non-unique values is required to be present in the resource. The method includes verifying equality between the content of the resource and a member of the set of non-unique values.

According to an aspect of the method, the resource is a memory resource.

According to an additional aspect of the method, the resource is a register.

In an additional aspect of the method the resource includes a first resource and a second resource. The set of non-unique values is a set of value-lists, and each member of the set of value-lists has a first value and a second value, the first value being a permissible value of the first adjacent resource, and the second value being a permissible values of the second adjacent resource. Verification of a valid member of the set is established by verifying an equality between a content of the first adjacent resource and the first value of a member; and verifying an equality between a content of the second adjacent resource and the second value of the member.

In one aspect of the method, associating the first and second members is performed by tagging the first member and the second member with a common combination identifier.

In another aspect of the method the first member of the first set of non-unique values includes a first value-list, and the second member of the second set of non-unique values includes a second value-list, respective elements of the first value-list being permissible values of the first resource and adjacent resources thereof, and respective elements of the second value-list being permissible values of the second resource and adjacent resources thereof. Verification is accomplished by verifying an equality between a content of the first resource and adjacent resources thereof with corresponding elements of the first value-list, and verifying an equality between a content of the second resource and adjacent resources thereof with corresponding elements of the second value-list.

According to a further aspect of the method, associating the set of non-unique values is performed prior to executing the first sequence of instructions in a dynamic simulation.

In yet another aspect of the method associating the set of non-unique values is performed by the steps of providing input statements to a test generator, defining a results section in the test program, and entering all permissible values assumable by the resource and an identifier of the resource in an entry of the results section.

According to still another aspect of the method executing the test program also includes generating the first sequence and the second sequence, and while generating, simulating one of the generated instructions in the first simulated process and the second simulated process, maintaining a store that contains a set of values that are assumable in the resource, and thereafter determining whether the store contains non-unique values.

An additional aspect of the method includes storing first values of the resource during accesses thereof by the first simulated process, and storing second values of the resource by the second simulated process during accesses thereof, wherein the first values comprise first written values, and the second values comprise second written values. The step of determining whether the store contains non-unique values includes identifying in the store a last value written to the resource by a simulation of the generated instruction.

One aspect of the method includes determining an initial state of the test program immediately prior to simulating a generated instruction, storing written values of target resources of the generated instruction during accesses thereof, identifying all combinations of values of input resources of the generated instruction, rolling back the test program to reestablish its initial state, thereafter resimulating the generated instruction for each of the identified combinations of values, reidentifying written values that are written to the target resources, and updating the store with the reidentified written values of the target resources.

Another aspect of the method includes establishing a synchronization barrier for the first and second processes.

Yet another aspect of the method includes biasing the generation of the test program to promote collisions of memory accessing instructions that are executed by the first and second processes.

The invention provides a method of verification of an architecture by simulation, including the steps of defining a program input to a test generator. The method includes generating a test program responsive to the program input, the test program including a list of resource initializations, a list of instructions, and a list of predicted resource results, wherein at least one member of the list of predicted resource results includes a plurality of permissible results, simulating an execution of the test program using a plurality of simultaneously executing processes, and verifying an actual resource result by determining that at least one of the plurality of permissible results is equal to the actual resource result.

An aspect of the method the list of predicted resource results includes predicting results of adjacent resources, wherein the adjacent resources are mutually dependent, and verifying equality between the predicted results and each of the corresponding adjacent resources.

According to one aspect of the method, the adjacent resources are memory resources.

According to another aspect of the method, the adjacent resources are registers.

According to a further aspect of the method, the list of predicted resource results includes predicted results of mutually dependent non-adjacent resources. The method includes identifying a combination of the mutually dependent non-adjacent resources by tagging corresponding members of a value-list of predicted resource results with a unique combination identifier. Verifying the actual resource result is performed by verifying that resources of the combination have actual results that are equal to a member of a corresponding one of the commonly tagged value-lists.

The invention provides a method of predicting non-unique results by simulating a system design, including the steps of defining a program input to a test generator, generating a test program responsive to the program input, the test program including a list of resource initializations, a list of instructions, and a list of predicted resource results, wherein at least one member of the list of predicted resource results includes a plurality of permissible results. The method includes simulating an execution of a single instruction of the test program by a process of the test program, and calculating possible values of target resources of the single instruction.

According to an aspect of the method, the target resources are memory resources.

According to yet another aspect of the method, the target resources are registers.

Yet another aspect of the method includes simulating an execution by a second process of the test program, maintaining process-linked lists of written values that are written to the target resources of the single instruction by the first process and the second process, and determining respective last values in the process-linked lists of written values.

The invention provides a computer software product, including a computer-readable medium in which computer program instructions are stored, which instructions, when read by a computer, cause the computer to execute a method for validating a processor design by simulating program execution, the method including the steps of identifying a resource that may be accessed by a test program that includes a first simulated process and a second simulated process, associating a set of non-unique values for the resource, executing the test program by executing a first sequence of instructions in the first simulated process, and while executing the first sequence, executing a second sequence of instructions in the second simulated process, wherein the resource is accessed by at least one of the first simulated process and the second simulated process, and wherein upon completion of the steps of executing the first sequence and executing the second sequence, a member of the set of non-unique values is required to be present in the resource, and verifying an equality between a content of the resource and a member of the set of non-unique values.

The invention provides a computer software product, including a computer-readable medium in which computer program instructions are stored, which instructions, when read by a computer, cause the computer to perform a method of verification of an architecture by simulation, including the steps of defining a program input to a test generator. The method includes generating a test program responsive to the program input, the test program including a list of resource initializations, a list of instructions, and a list of predicted resource results, wherein at least one member of the list of predicted resource results includes a plurality of permissible results, simulating an execution of the test program using a plurality of simultaneously executing processes, and verifying an actual resource result by determining that at least one of the plurality of permissible results is equal to the actual resource result.

According to an aspect of the computer software product, the list of predicted resource results includes predicted results of adjacent resources, wherein the adjacent resources are mutually dependent, and verifying the actual resource result is performed by verifying each of the adjacent resources.

According to an additional aspect of the computer software product, the list of predicted resource results includes predicted results of mutually dependent non-adjacent resources. The method includes identifying a combination of the mutually dependent non-adjacent resources by tagging corresponding members of the list of predicted resource results with a unique combination identifier, and verifying the actual resource result is performed by verifying that resources of the combination have actual results that are equal to a member of a corresponding one of the commonly tagged value-lists.

The invention provides a computer software product, including a computer-readable medium in which computer program instructions are stored, which instructions, when read by a computer, cause the computer to perform a method of predicting non-unique results by simulating a system design, including the steps of defining a program input to a test generator, generating a test program responsive to the program input, the test program including a list of resource initializations, a list of instructions, and a list of predicted resource results, wherein at least one member of the list of predicted resource results includes a plurality of permissible results, simulating an execution of a single instruction of the test program by a first process of the test program, and calculating possible values of target resources of the single instruction.

According to an aspect of the computer software product, the method includes simulating an execution by a second process of the test program, maintaining process-linked lists of written values that are written to the target resources of the single instruction by the first process and the second process, and determining respective last values in the process-linked lists of written values.

Another aspect of the computer software product the method includes the steps of, prior to simulating execution by the first process and the second process, memorizing an initial simulated state of the test program, maintaining process-linked lists of read values that are read from source resources of the single instruction, identifying a member of the lists of read values having a unique value, restoring the initial simulated state of the test program, simulating the execution a second time, reading the identified member, using an associated process thereof.

The invention provides an apparatus for verifying a design including a simulation processor which is adapted to perform the steps of identifying a resource that is accessed by a test program. The test program includes a first simulated process and a second simulated process. The steps include associating a set of non-unique values for the resource, executing the test program by the steps of executing a first sequence of instructions in the first simulated process, and while executing the first sequence, executing a second sequence of instructions in the second simulated process, wherein the resource is accessed by at least one of the first simulated process and the second simulated process, and wherein upon completion of the steps of executing the first sequence and executing the second sequence, a member of the set of non-unique values is required to be present in the resource. The steps include verifying an equality between a content of the resource and a member of the set of non-unique values.

The invention provides an apparatus for verifying an architecture by simulation including a simulation processor which is adapted to perform the steps of defining a program input to a test generator. The steps include generating a test program responsive to the program input, the test program including a list of resource initializations, a list of instructions, and a list of predicted resource results, wherein at least one member of the list of predicted resource results includes a plurality of permissible results, simulating an execution of the test program using a plurality of simultaneously executing processes, and verifying an actual resource result by determining that at least one of the plurality of permissible results is equal to the actual resource result.

The invention provides an apparatus for design verification in which program instructions are stored, which instructions cause a processor to execute a method of predicting non-unique results by simulating a system design, including the steps of defining a program input to a test generator. The method includes generating a test program responsive to the program input, the test program including a list of resource initializations, a list of instructions, and a list of predicted resource results, wherein at least one member of the list of predicted resource results includes a plurality of permissible results, simulating an execution of a single instruction of the test program by a first process of the test program, and calculating possible values of target resources of the single instruction.

BRIEF DESCRIPTION OF THE DRAWINGS

For a better understanding of these and other objects of the present invention, reference is made to the detailed description of the invention, by way of example, which is to be read in conjunction with the following drawings, wherein.

DETAILED DESCRIPTION OF THE INVENTION

In the following description, numerous specific details are set forth in order to provide a thorough understanding of the present invention. It will be apparent to one skilled in the art, however, that the present invention may be practiced without these specific details. In other instances well-known circuits, control logic, and the details of computer program instructions for conventional algorithms and processes have not been shown in detail in order not to unnecessarily obscure the present invention.

Software programming code, which embodies aspects of the present invention, is typically maintained in permanent storage, such as a computer readable medium. In a client/server environment, such software programming code may be stored on a client or a server. The software programming code may be embodied on any of a variety of known media for use with a data processing system, such as a diskette, or hard drive, or CD-ROM. The code may be distributed on such media, or may be distributed to users from the memory or storage of one computer system over a network of some type to other computer systems for use by users of such other systems. The techniques and methods for embodying software program code on physical media and distributing software code via networks are well known and will not be further discussed herein.

Definitions.

Several terms used herein are now explained.

Barrier: A barrier is a section of code, written using synchronization primitives, and placed within each participating processor's stream. Its purpose is to ensure no participating processor continues past it until all participating processors have reached it in their respective streams. In addition, when a processor reaches a barrier, all storage accesses initiated prior to the barrier must be performed with respect to all the other processors.

Coherent accesses: All accesses to a particular location are said to be coherent if all stores to the same location are serialized in some order and no processor can observe any subset of those stores in a conflicting order. That is, a processor can never load a "new" value first, and later load an "older" value.

Resource: either a specific memory location, a specific register, a specific cache line, etc.

Adjacent resources: resources having contiguous addresses. In the case of registers, "adjacent resources" refers to registers having contiguous indexes; e.g., Registers R1 and R2 are considered to be adjacent.

Resource-id: an identification of a resource, e.g. memory address 1000, register R2.

Value: a number representing the contents of a resource.

Architecture: the design specification being verified.

Architectural Overview.

Figure 1:
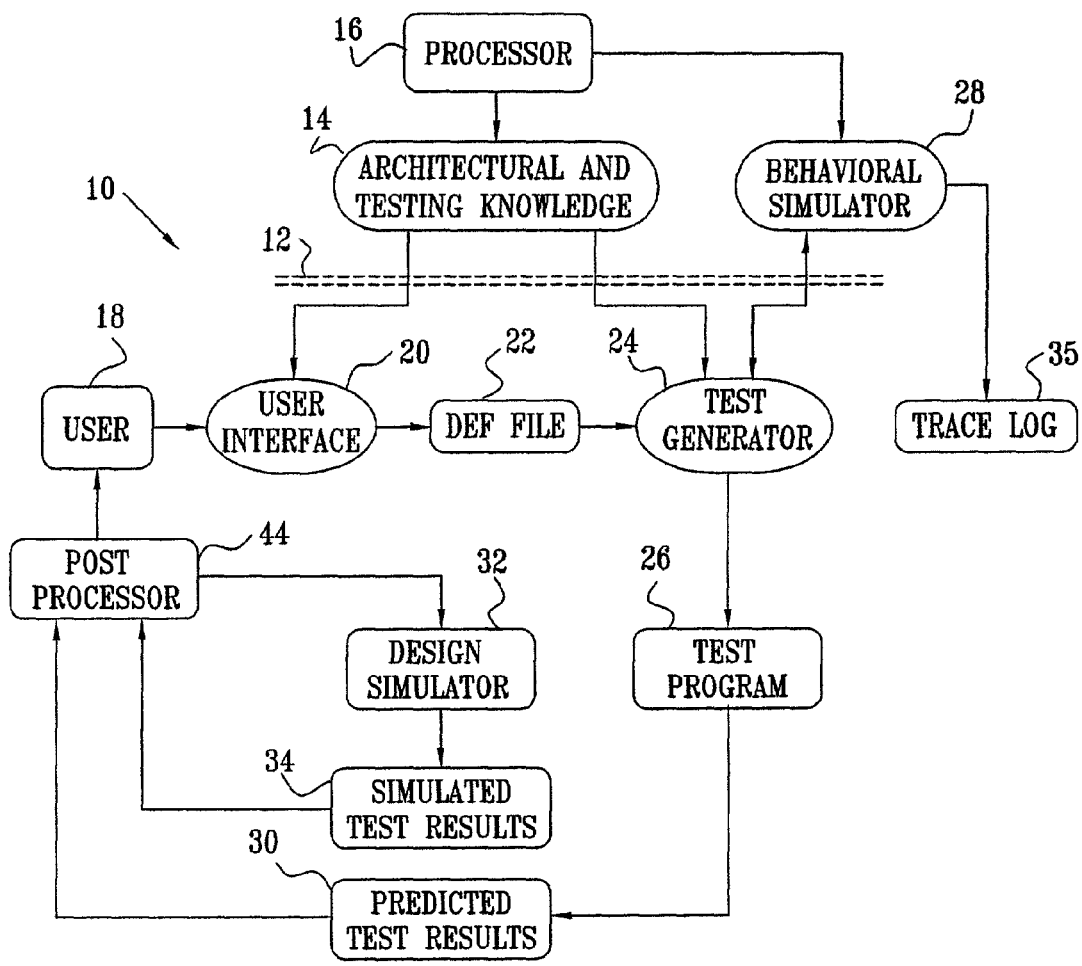
FIG. 1 is a block diagram of a test program generator that is operable in accordance with a preferred embodiment of the invention.

Reference is now made to FIG. 1, which is a block diagram of a test program generator that is operable in accordance with a preferred embodiment of the invention. A verification system 10, used for verifying a computer processor or an integrated circuit, has several basic interacting components. Those components of the verification system 10 that are located above a broken line 12 are dependent on the architecture of the processor being verified, while those located below the line 12 are architecture independent. Components that are architecture independent are termed "generic".

The verification system 10 enables the creation of tests that have various degrees of randomness, and can be totally random. The ability of the verification system 10 to introduce random unspecified parameters is fundamental, since design flaws in practice are usually unpredictable. The verification system 10 includes a generic architectural level test generator engine 24 that outputs tests primarily for architectural verification, for example verification of architectural resources such as memory and registers. It is usually desirable that the generator engine 24 have some capabilities for testing microarchitectural features as well, for example caches, pipelines, and out-of-order instruction execution. Even in those embodiments in which microarchitecture cannot be explicitly tested, it is often possible to stimulate the activation of microarchitectural features using architectural level test programs.

An architectural model 14 holds a formal and declarative description of the architecture of a multiprocessor 16. This specification is preferably stored in a database, which may also incorporate testing knowledge and microarchitectural features of the processor. The integration of all the information stored in the architectural model 14 is referred to herein as the knowledge base of the test program generator. The incorporation of microarchitectural parameters into the knowledge base facilitates testing microarchitectural resources, while using architectural level test generation. The knowledge base typically includes heuristics, which represent test engineering expertise, and the knowledge base is designed to allow expert users to add knowledge. Many databases suitable for storing the architectural model 14 are known.

A user 18 provides direction to the operation of the generator engine 24 using a user interface 20. With the user interface 20 the user 18 controls biasing directives that result in challenging scenarios, and cause different microarchitectural events. Directives of the user 18 are preferably encapsulated into files called definition files ("def files") by the user interface 20, shown as a def file 22. The content of the def file 22 is the input to the generator engine 24. The def file 22 is the main medium through which the test generator engine 24 is influenced by the user 18. This influence includes, for example, specifying the number of tests programs that are to be generated, the identity of the test instructions, their relative order, and various events relating to the instructions. A biasing directive input by the user 18 could influence the test generator engine 24, for example, to generate sequences of addresses near the boundary of a user-defined storage partition, rather than in locations remote from the boundary. Many biasing directives are known in the art, and will not be reiterated herein.

The user interface 20 is configured to allow the user 18 to define input streams. Preferably the user interface 20 is a graphical interface which is adapted for convenient entry of def file entries or statements, and the designation of appropriate actions for certain kinds of statements. The user interface 20 supports the entry of events, process control, multi-process control, macros, verbatim statements, reentrancy, and resource control.

In addition to receiving input from the user 18 via the def file 22, the test generator engine 24 receives input information from the architectural model 14. The test generator engine 24 emits a test program 26. Preferably the test generator engine 24 is equipped with some knowledge of the microarchitectural parameters, and can exploit this knowledge so as to generate sequences of instructions triggering the microarchitecture in various ways.

The output of the test generator engine 24 is a sequence of instructions. In a dynamic mode of operation, each instruction is first generated by the test generator engine 24, and test results 30 are predicted by a behavioral simulator 28. Generation involves selecting the opcode, the operands and the resources, and initializing the participating resources not yet used. Once this is done, the instruction built by the test generator engine 24 is passed to a design simulator 32 for simulation, and the production of simulated test results 34. This cycle continues with the next instruction.

The behavioral simulator 28 is used to predict the results of instruction execution in accordance with the specification of the multiprocessor 16. Any conventional behavioral simulator is suitable for the behavioral simulator 28. During operation of the test generator engine 24, a trace log 36 may be produced by the behavioral simulator 28, which contains messages and errors relating to the test simulation. Test results 30 that are generated by the design simulator 32 during the simulated execution of the test program 26 are captured by the test generator engine 24, inserted into the test, and eventually made available to the user 18 for evaluation. In the following disclosure references to resource values concern values that are reported in the test results 30, and which are supplied to the test generator engine 24 by the behavioral simulator 28.

Test Program—General.

Figure 2:
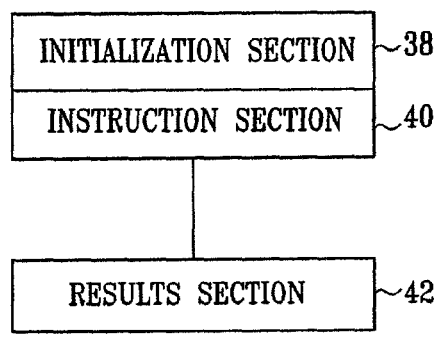
FIG. 2 is a block diagram of a test program which is generated by the test program generator shown in FIG. 1.

Reference is now made to FIG. 2, which is a block diagram of the test program 26 (FIG. 1). A test program includes an initialization section 38, instruction section 40, and a results section 42.

The initialization section 38 is a list of resource initializations ("initialization cards"), each having the form INIT <resource-id, value>.

This section defines the state of the resources as they are before the test program is to be simulated. Initializations of the resource holding the binary code of the test instructions, are found in a specialized portion of the initialization section 38, which is the instruction section 40. Every resource used as input to any of the instructions in the instruction section 40 must be initialized in the initialization section 38. The behavioral simulator 28 requires these initializations so as to accurately predict the results of executing test instructions according to the architectural specification. Typically, the resources holding the test instructions are memory.

The results section 42 is a list of resource results ("result cards"}. In a simple case, where unique results are expected, the result card has the form RESULT <resource-id, value>.

The results section 42 gives the final state of the named resources as specified by the architecture and predicted by the behavioral simulator 28 that is used by the test generator engine 24. This state is to be compared with the test results 34 that are the outcome of running the generated test on the design simulator 32. In some embodiments, this comparison is accomplished using a postprocessor 44, which also provides feedback control to the design simulator 32. Postprocessors are disclosed in U.S. Pat. No. 6,285,974, which is assigned to International Business Machines Corporation, and incorporated by reference herein.

It is advisable that every resource used as either an input or an output of any of the instructions in the instruction section 40 be listed both in the initialization section 38 and in the results section 42. If such a resource is not mentioned in the results section 42 then its predicted value according to the architecture will not be known, and a design error could be overlooked.

It is mandatory that the program counter be listed among the resources in the initialization section 38.

Multiprocess Test Program Structure.

The test program 26 can represent multiprocess programs if it includes an initialization of the program counters for each of the processes. The resource-id is required to identify the process that is the owner of the resource, e.g., register R5 of process 7. The instruction section 40 includes the opcodes of instructions for all processes. The initialization section 38 and the results section 42 list the resources used by these instructions as described above.

Non-Unique Results—Scenarios with Unspecified Results.

Continuing to refer to FIG. 2, there are situations in which the design specification does not specify the outcome of an instruction or a scenario. For example, the architecture may stipulate that after a divide-by-zero instruction the value of the target register is unspecified. In such a case, every value would be a valid result for such a resource.

In another case different outcomes could occur under the same scenario, depending on unpredictable conditions, e.g., micro-architecture start-up states, and various physical conditions.

Verification using test programs that include such scenarios can still produce useful information. If result possibilities are limited, test programs can verify that the design does not overstep the limits. For example, if the design specification states that a divide-by-zero operation can result in any positive number, the test programs can still uncover a design flaw that produces a negative number.

Even when the design specification allows an indefinite outcome in some resources that are involved in a scenario, test programs nevertheless have value in verifying that there is no flaw that causes other resources to be mispredicted.

When a mode of operation is chosen such that non-unique results can be expected, then each result card in the results section 42 represents a set of all permissible values (set-of-values) that could be assumed by the named resource. In such a mode, the result card has the form RESULT <resource-id, set-of-values>.

In the case of a resource having a unique permissible value, the set-of-values has only one member.

In some embodiments, the result cards may also include impermissible values. The occurrence of such impermissible values as part of the result cards is termed "results inexactness". Inclusion of impermissible values in the set is sometimes necessary when there are difficulties predicting or in expressing exact results. However, it is not generally recommended, as failure to detect a design flaw could result.

Non-Unique Results—Undetermined Ordering of Events.

In multi-process scenarios, the list of instructions executed by each of the processes may not include enough information to enable the prediction of the results in the resources involved. This is because different orders of execution of instructions belonging to different processes may result in different outcomes in these resources. Several process execution orders may be possible for the same test due to different process speeds, bus priorities, startup conditions and many other micro-architectural reasons. Test results are predicted by the embodiments disclosed herein using an architecture reference model, which predicts according to a design specification that generally does not take micro-architectural considerations into account.

General Operation.

Figure 3:
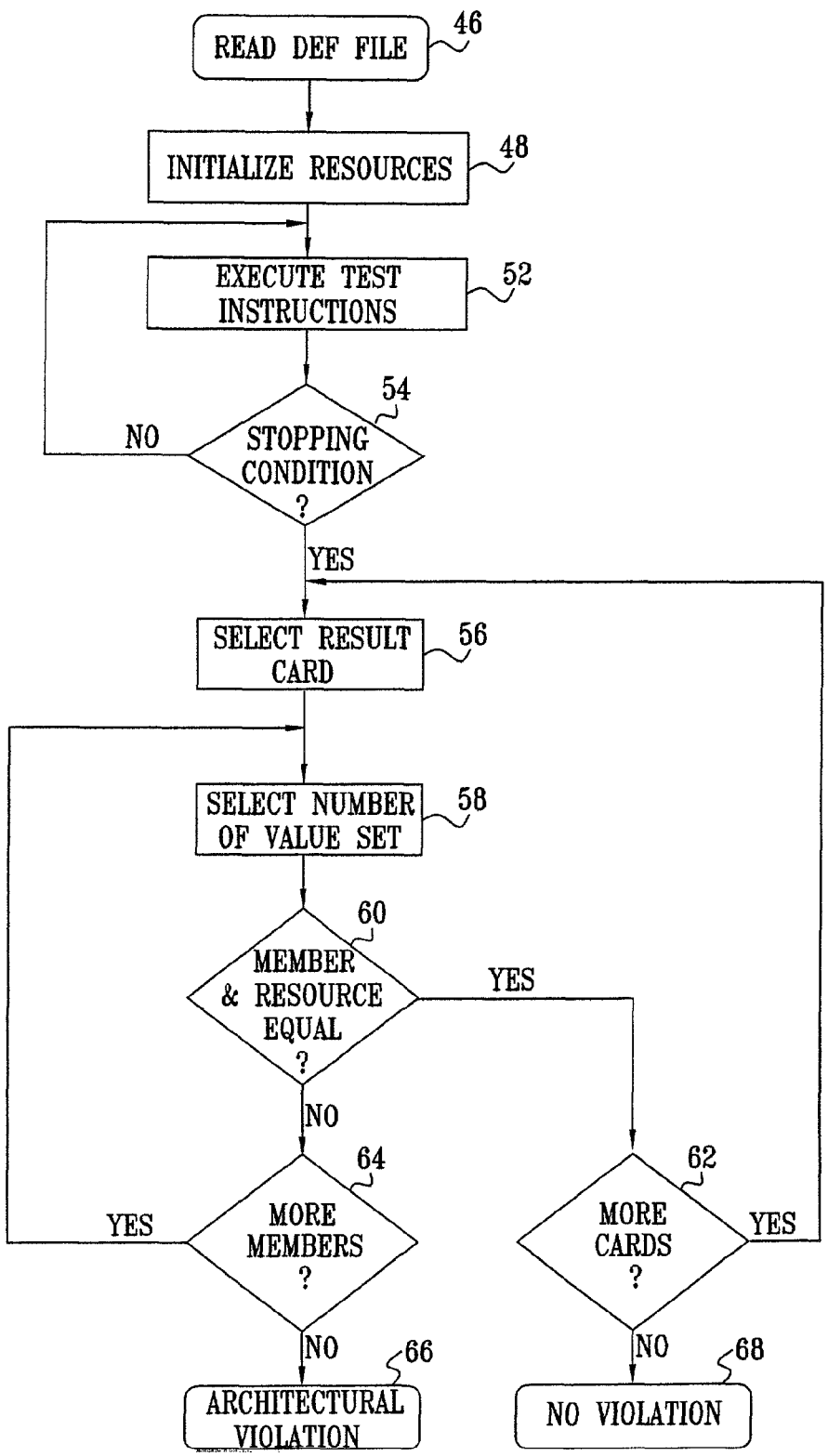
FIG. 3, is a flow diagram illustrating a method of comparing predicted and simulated result comparison of a test program in a design simulation in accordance with a preferred embodiment of the invention.

Reference is now made to FIG. 3, which is a flow diagram illustrating the operation of simulating the generated test of the generator engine 24 with the design simulator 32 (FIG. 1). The disclosure of FIG. 3 should be read in conjunction with FIG. 1 and the test program structure disclosed hereinabove.

The operation begins at initial step 46, where the test program 26 (FIG. 1) is read in order to obtain values given in the initialization section 38 and the instruction section 40 (FIG. 2).

Next, at step 48, resources are initialized according to the values read at initial step 46. This includes the initialization of the memory locations holding the opcode of the test's instruction, the resources used by these instructions, and the program counters of the participating processes.

Next, test instructions produced by the test generator engine 24 are executed in step 52, using the design simulator 32 (FIG. 1). During execution of the test instructions, control is transferred to decision step 54 from time to time, where it is determined if a stopping condition has occurred. Stopping conditions include the presence of specified instruction sequences, and identified program errors. Pointing of the program counter to an undefined resource is typical example of an error causing a stopping condition.

If the determination at decision step 54 is negative, then control returns to step 52, and execution of the test instructions continues.

If the determination at decision step 54 is affirmative, then the result checking phase begins. Control proceeds to step 56.

Non-unique results from the test are expected, and it is necessary to examine all acceptable values that could be assumed by a resource. In step 56 a result card is selected from the list found in the results section 42 (FIG. 2). It will be recalled that a set of values is associated with the result-id of the resource cards.

Next at step 58 a member is chosen from the set of values (set-of-values) found in the result card that was selected in step 56. Step 58 reduces to the trivial case if unique results are required for the resource associated with the current result card, as only one member exists in the set of values.

Control now proceeds to decision step 60, where it is determined if the value of the member of the set of values that was selected in step 58 and the actual value of the resource associated with the result-id of the current resource card are equal. The details of decision step 60 are explained below with reference to FIG. 4.

If the determination at decision step 60 is affirmative, then control passes to decision step 62, which will be disclosed below.

If the determination at decision step 60 is negative, then an architectural violation with respect to the result-id of the current resource card cannot be excluded. If members of the set of values in the current resource card have not yet been evaluated, they must now be processed. Control proceeds to decision step 64, where it is determined if more members of the set of values in the current result card remain to be processed.

If the determination at decision step 64 is affirmative, then control returns to step 58.

If the determination at decision step 64 is negative, then control proceeds to final step 66. It has now been established that the value actually held by the resource is not a member of the set of values given in the current result card. It is concluded that an architectural violation with respect to the result-id of the current resource card has been detected by the test, and the process terminates.

Decision step 62 is performed if the determination at decision step 60 is affirmative. The value actually held by the resource that is associated with the result-id of the current resource card is a member of the set of values given in the current result card. It is known that no architectural violation has been detected by the test with respect to the result-id of the current resource card. At decision step 62, a determination is made whether more result cards remain to be evaluated.

If the determination at decision step 62 is affirmative, then control returns to step 56.

If the determination at decision step 62 is negative, then control proceeds to final step 68. All resource cards of the results section 42 (FIG. 2) have now been processed. It is concluded that no architectural violation has been detected by the test, and the process terminates.

The examples of test programs, which follow, are disclosed with reference to FIG. 1, FIG. 2, and FIG. 3.

EXAMPLE 1

Multiprocessor Test Program with Unique Results

Listing 1

INITIALIZATION SECTION
INIT <register R1 of process 1, 1>
INIT <register PC of process 1, 1000>
INIT <register R1 of process 2, 2>
INIT <register PC of process 2, 2000>
INSTRUCTIONS SECTION
INIT <memory 1000-1003, 4 byte binary representation of the instruction "store R1->3000">
INIT <memory 2000-2003, 4 byte binary representation of the instruction "store R1->4000">
RESULTS SECTION
RESULT <memory 3000, 1>
RESULT <memory 4000, 2>

The results of the test shown in Listing 1 can be verified using the procedure of FIG. 3.

EXAMPLE 2

Multiprocessor Test Program with Non-Unique Results Due to Write-Write Collision Listing 2

INITIALIZATION SECTION
INIT <register R1 of process 1, 1>
INIT <register PC of process 1, 1000>
INIT <register R1 of process 2, 2>
INIT <register PC of process 2, 2000>
INSTRUCTIONS SECTION
INIT <memory 1000-1003,4 byte binary representation of the instruction "store R1->3000">
INIT <memory 2000-2003, 4 byte binary representation of the instruction "store R1->3000">
RESULTS SECTION
RESULT <memory 3000, {1, 2}>

In this test example, if the store operation of process 1 completes before the store operation of process 2 then, the result in memory address 3000 should be 2. On the other hand, if the store operation of process 2 completes before the store operation of process 1, then the result in memory address 3000 should be 1. It may be noted from inspection of the RESULTS SECTION of Listing 2 that the values 1 and 2 constitute the entire set of permissible values in the memory 3000 on completion of the test program.

There is not enough information in the test program to determine which of the two outcomes will actually occur when simulating the program using the design simulator 32. However, if executing the test produces any value other than the values 1 or 2, then an architectural violation will have been demonstrated.

The results of the test shown in Listing 2 can be verified using the procedure of FIG. 3.

It may be noted that a design flaw that results in the store operation of process 1 completing first, but where the memory 3000 has the value 1 cannot be detected by the test shown in Listing 2.

EXAMPLE 3

Multiprocessor Test Program with Non-Unique Results Due to Write-Read Collision

Listing 3

INITIALIZATION SECTION
INIT <register R1 of process 1, 1>
INIT <register PC of process 1, 1000>
INIT <memory 3000, 0>
INIT <register PC of process 2, 2000>
INSTRUCTIONS SECTION
INIT <memory 1000-1003, 4 byte binary representation of the instruction "store R1->3000">
INIT <memory 2000-2003, 4 byte binary representation of the instruction "load 3000->R1">
RESULTS SECTION
RESULT <memory 3000, 1>
RESULT <register R1 of process 2, {0, 1}>

In the example of Listing 3, if the store operation of process 1 store completes before the load operation of process 2 then the result in register R1 of process 2 should be 1. If the load operation of process 2 completes first, then the result in register R1 of process 2 should be 0.

The results of the test shown in Listing 3 can be verified using the procedure of FIG. 3 in the same manner as the test program of Listing 2.

EXAMPLE 4

Non-Unique Result Propagation

The test program of Listing 4 is similar to that of Listing 2, but includes further propagation of the non-unique result in memory address 3000.

Listing 4

INITIALIZATION SECTION
INIT <register R1 of process 1, 1>
INIT <register PC of process 1, 1000>
INIT <register R1 of process 2, 2>
INIT <register PC of process 2, 2000>
INSTRUCTIONS SECTION
1. INIT <memory 1000-1003, 4 byte binary representation of the instruction "store R1->3000">
2. INIT <memory 2000-2003, 4 byte binary representation of the instruction "store R1->3000">
3. INIT <memory 2004-2007, 4 byte binary representation of the instruction "load 3000->R2">
4. INIT <memory 2008-200B, 4 byte binary representation of the instruction "add R2+R2->R3">
RESULTS SECTION
RESULT <memory 3000, {1, 2}>
RESULT <register R2 of process 2, {1, 2}>
RESULT <register R3 of process 2, {2, 4}>

If the instructions in the INSTRUCTIONS SECTION of Listing 4 were executed in the order 1->2->3->4, then the memory 3000, and the registers R2 and R3 should contain the values 2, 2, and 4 respectively. If the order or execution were 2->1->3->4, then the memory 3000, and the registers R2 and R3 should contain the values 1, 1, and 2 respectively. There are other possible instruction orderings, each giving one of these two result combinations. The "non-uniqueness" of memory address 3000 can be viewed as propagating first to the register R2 and from there to the register R3.

The results of the test of Listing 4 can be verified using the procedure of FIG. 3, or with certain modifications that are disclosed hereinbelow.

The examples of Listing 2, Listing 3, and Listing 4 demonstrate that some scenarios can only be verified using tests with non-unique results. In fact, it is just these types of examples that are the most useful scenarios to verify in a multi-process design. In such designs, write-write and write-read collision scenarios, such as those in the above examples, typically trigger complex design mechanisms, e.g., cache coherency and bus arbitration protocols, which would not be triggered otherwise. Test programs involving propagation of non-unique values, such as shown in Listing 4, may be necessary in order to fully verify a multiprocess scenario.

Non-Unique Results—Dependencies Involving Adjacent Resources.

As the program of Listing 4 demonstrates, there may be cases where there exist two resources, each with non-unique results, but where not every combination is valid. In Listing 4, memory 3000 and register R2 may contain either of the values 1 or 2 and register R3 may contain either of the values 2 or 4. In the embodiment of FIG. 3, all of the eight combinations of these value would be accepted. However, only the combinations {1,1,2}, {1,2,4}, and {2,2,4}, for the memory 3000 and the registers R2 and R3 respectively, are permissible. If any of the remaining six combinations were to result, an architectural violation would exist, which would be undetected by the method according to FIG. 3.

Fortunately, it is possible to enhance the method disclosed with reference to FIG. 3 in order to deal with such dependencies. In the following disclosure of a first alternate embodiment of the invention, it is assumed that the dependent resources are adjacent memory locations.

First Alternate Embodiment.

Reference is again made to FIG. 3, which can be applied in accordance with an alternate embodiment of the invention. The modifications of this alternate embodiment are useful in detecting design flaws dealing with mechanisms that are responsible for maintaining atomicity in memory accesses. Atomicity is discussed in further detail hereinbelow.

The result cards of the results section 42 (FIG. 2) are modified to add additional syntactic possibilities. The set of values previously of the above result card is now generalized to become a set of value-lists (set-of-value-lists).

Here the term "value-list" refers to a hyphen-separated list of values, each element of which corresponds respectively to the value of the resource identified in the resource-id of the result card and its succeeding adjacent resources. In the case where no adjacent resource dependency exists, each value-list of the set-of-value-lists has only one member, and the set-of-value-lists is then equivalent to the set-of-values which has been disclosed above.

The result cards now have the form

RESULT <resource-id, set-of-value-lists>.

For example the statement,

Result <Memory 3000, {1-1, 2-2}> includes a first value-list 1-1, the elements 1, 1 thereof relating to adjacent memory locations 3000 and 3001 respectively. The value 1 in memory location 3000 in combination with the value 1 in memory location 3001 is allowable. Similarly, for a second value-list 2-2 of the set, the value 2 in memory location 3000 in combination with the value 2 in memory location 3001 is also allowable. No other combinations are allowable. A test that has produced the value 1 in memory location 3000 and the value 2 in memory location 3001 has produced results that violate the design specification.

A portion of the method shown in FIG. 3 is performed. Initial step 46, step 48, step 52, and decision step 54 are performed as disclosed hereinabove. The description of these steps is not repeated in the interest of brevity. It is understood that no stopping condition has occurred, and control has passes to step 56.

At step 56 a result card is selected from the list found in the results section 42 (FIG. 2).

Next, at step 58 a member of the set-of-value-lists given in the result card selected in step 72 is chosen. As explained above, each element of the chosen value-list is respectively an acceptable value of the resource referenced by the resource-id of the current result card and its succeeding adjacent resources.

Control now passes to decision step 60. Here a determination is made whether an architectural violation exists with respect to the resource-id in the current resource card. This is done by examining each member of the value-list chosen in step 58 as described below.

Figure 4:
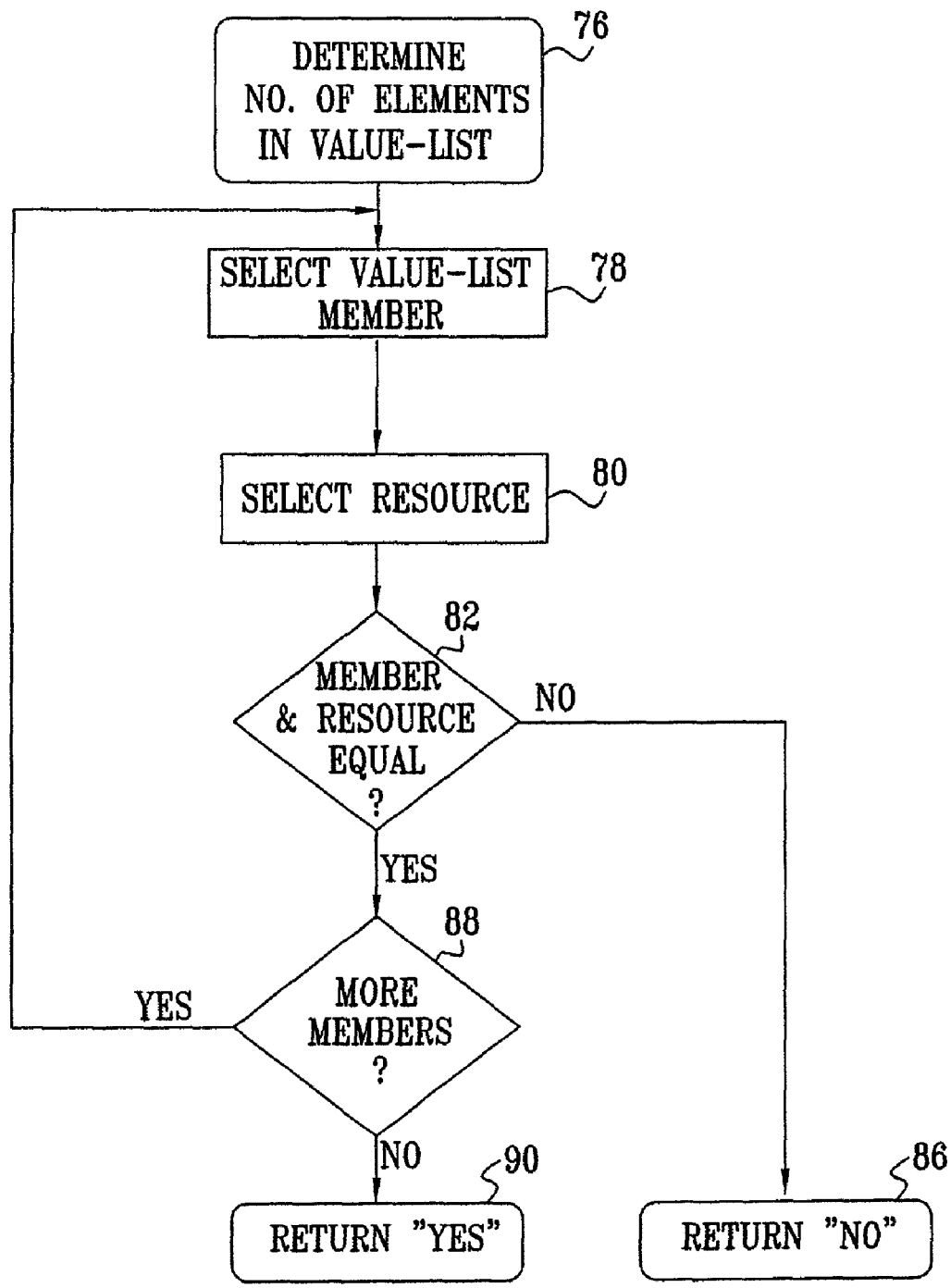
FIG. 4 is a flow diagram illustrating a method of evaluating a value-list according to a preferred embodiment of the invention.

Reference is now made to FIG. 4, which is a flow diagram of the procedure for examining the chosen value-list. At initial step 76, the number of elements of the value-list is determined. In the steps that follow, the resource designated by the resource-id of the target value-list and its adjacent resources are compared against corresponding values given in the list of values of the target value-list. The number of actual resources to be compared is equal to the number of elements of this list.

Control now passes to step 78. An element of the list of values in the target value-list is selected.

Next, in step 80 an actual resource is identified. The actual resource is offset from the resource that is designated by the resource-id of the result card associated with the target value-list.

Control now passes to decision step 82, where it is determined if the element selected in step 78 and the value of the actual resource identified in step 80 are equal.

If the determination at decision step 82 is negative, then control proceeds to final step 86 where a value "NO" is returned, and is processed in decision step 60 (FIG. 3).

If the determination at decision step 82 is affirmative, then control proceeds to step 88, where a determination is made whether all the values in the list of values of the target value-list have been evaluated.

If the determination at decision step 88 is affirmative, then more adjacent resources need to be evaluated. Control returns to step 78.

If the determination at decision step 88 is negative, then control proceeds to final step 90, where a value "YES" is returned, and is processed in decision step 60 (FIG. 3).

Referring again to FIG. 3, the determination at decision step 60 whether an architectural violation exists with respect to the value-list chosen in step 58 is negative if the value "NO" was returned in final step 86 (FIG. 4), and is affirmative if the value "YES" was returned in final step 90 (FIG. 4).

If the determination at decision step 60 is affirmative, then control proceeds to decision step 62, which will be disclosed below.

If the determination at decision step 60 is negative, then an unacceptable resource value has been found in the current value-list. At this point, an architectural violation with respect to the current resource-id cannot be excluded, and if any other value-lists in the set of value-lists of the current resource card remain to be evaluated they must now be processed. At decision step 64, a determination is made whether more value-lists in the current resource card remain to be evaluated.

If the determination at decision step 64 is affirmative, then control returns to step 58.

If the determination at decision step 64 is negative, then no member of the set of value-lists in the current resource card is an acceptable value-list. It is concluded that an architectural violation has been detected with respect to the resource-id in the current resource card, and the procedure terminates at final step 66.

Decision step 62 is performed if the determination at decision step 60 was affirmative. An acceptable combination of results has been detected with respect to the resource designated by the resource-id of the current result card. It is not necessary to evaluate other members of the set of value-lists of the current result card. At decision step 62, a determination is made whether more result cards remain to be processed.

If the determination at decision step 62 is affirmative, then control returns to step 56.

If the determination at decision step 62 is negative, then control proceeds to final step 68. All resource cards have now been processed, and no architectural violations have been detected. The process terminates.

EXAMPLE 5

Adjacent Resource Dependencies

Listing 5

INITIALIZATION SECTION
INIT <register R1 of process 1, 11>
INIT <register PC of process 1, 1000>
INIT <register R1 of process 2, 22>
INIT <register PC of process 2, 2000>
INSTRUCTIONS SECTION
INIT <memory 1000-1003, 4 byte binary representation of the instruction "store R1->3000">
INIT <memory 2000-2003, 4 byte binary representation of the instruction "store R1->3000">
RESULTS SECTION
RESULT <Memory 3000, {1-1, 2-2}>
RESULT <memory 3001, {1, 2}>

In the example of Listing 5, suppose that the registers R1 are 16 bits long (i.e. 2 bytes). Also, let the store instruction store the two byte value into the two bytes of memory locations 3000 and 3001. If these store instruction are executed "non-atomically", i.e., byte-by-byte, then each of the four combinations represented by the results section of Listing 5, i.e. 1,1; 1,2; 2,1; and 2,2 would all be acceptable outcomes. However, if the store instructions execute atomically, i.e., the two bytes are written together in an indivisible operation, then only the results 1, 1 and 2, 2 are allowed.

Design flaws involving the atomicity of the storage instructions will be detected by using results showing dependencies of adjacent resources and checking these results, using the method disclosed in FIG. 3 as applied to value-lists.
Non-Unique Results—General Dependencies.

Listing 4 shows that there may be dependencies between non-adjacent resources and even among resources of different types, i.e., memory and registers. In order to express such dependencies the syntax of the result card of results section 42 (FIG. 2) can be changed to add yet another syntactic option, as follows. A data structure is defined which includes a combination identifier (combination-id) and a value-list. The data structure is referred to herein as a "tagged value-list". The term "combination-id" is an identifier, e.g., a string of literals, which identifies a particular outcome of the test. The value-list associated the combination-id represents an allowed sub-combination of results, as has been disclosed above. The result syntax is now modified as follows. The set of value-lists is replaced by a set of tagged value-lists (set-of-tagged-value-lists).

RESULT <resource-id, set-of-tagged-value-lists>
A combination-id that appears in result cards of the results section 42 acts as a link to reference a particular outcome with respect to the resource-id of all result cards in which it appears.

The combination-id "ALL" has a special meaning: the value-list of the tagged value-list data structure with the string "ALL" contains value-lists of results that are valid for all possible outcomes involving the dependent resources relating to the resource-id of that result card.

The use of the combination-id can be further appreciated with reference to the following example.

EXAMPLE 6

General Dependencies

The example of Listing 6 is a variation of Listing 4 with atomic writes, where the identifiers A, B and the special identifier ALL are combination-ids.

Listing 6

INITIALIZATION SECTION
INIT <register R1 of process 1, 11>
INIT <register PC of process 1, 1000>
INIT <register R1 of process 2, 22>
INIT <register PC of process 2, 2000>
INSTRUCTIONS SECTION
1. INIT <memory 1000-1003, 4 byte binary representation of the instruction "store R1->3000">
2. INIT <memory 2000-2003, 4 byte binary representation of the instruction "store R1->3000">
3. INIT <memory 2004-2007, 4 byte binary representation of the instruction "load 3000->R2">
4. INIT <memory 2008-200B, 4 byte binary representation of the instruction "add R2+R2->R3">
RESULTS SECTION
RESULT <memory 3000, {<A,1-1>,<B,1-1>,<C,2-2>}>
RESULT <register R1 of process 1, {<ALL,11>}
RESULT <register R1 of process 2, {<ALL,22>}
RESULT <register R2 of process 2, {<A,11>,<B,22>, C,22>}>
RESULT <register R3 of process 2, {<A,22>,<B,44>, C,44>}>

Listing 6 is a program having two processes, process 1, and process 2. The results section of Listing 6 signifies that there are three possible outcomes of the test program. In the first outcome, indicated by the combination-id A, the memory locations 3000 and 3001 each contain the value 1. The register R1 for process 1 both contains the value 11, and the register R2 of process 2 contains the value 22. The register R3 of process 2 contains the value 22.

The second possible outcome, indicated by the combination-id B, is similar to the first outcome except that the register R2 contains the value 22 and the register R3 contains the value 44. The third possible outcome, indicated by the combination-id C, is similar to combination B except that the memory locations 3000 and 3001 each contain the value 2.

In order to deal with general dependencies, the result checking phase is modified to check if there exists a combination-id in the results section 42 that corresponds to the results actually arrived at by the design simulator. The result checking phase is conducted according to pseudocode fragment of Listing 7.

Listing 7

```
For every combination-id CID mentioned in the RESULT
SECTION
{
COMBINATION_FAILED = FALSE
For every resource card in the RESULT SECTION of the form
    RESULT <resource, set> and as long as
    COMBINATION_FAILED == FALSE
    {
    if the set of value-lists has a value-list paired
    with CID or with the special identifier ALL,
    then
        assign this value-list to VL
    else
        Fail (There is a syntax error in the test, since
        a resource result card fails to mention some specific
        combination-id or the special identifier All)
```

Check the adjacent resources that correspond to elements of the value-list, starting from resource and of length equal to the length of VL as predicted by the design simulator.

```
    If this value-list does not equal VL then
        COMBINATION_FAILED = TRUE
    }
    if COMBINATION_FAILED = FALSE
        return SUCCESS
}
return FAILURE
```

Second Alternate Embodiment.

Figure 5:
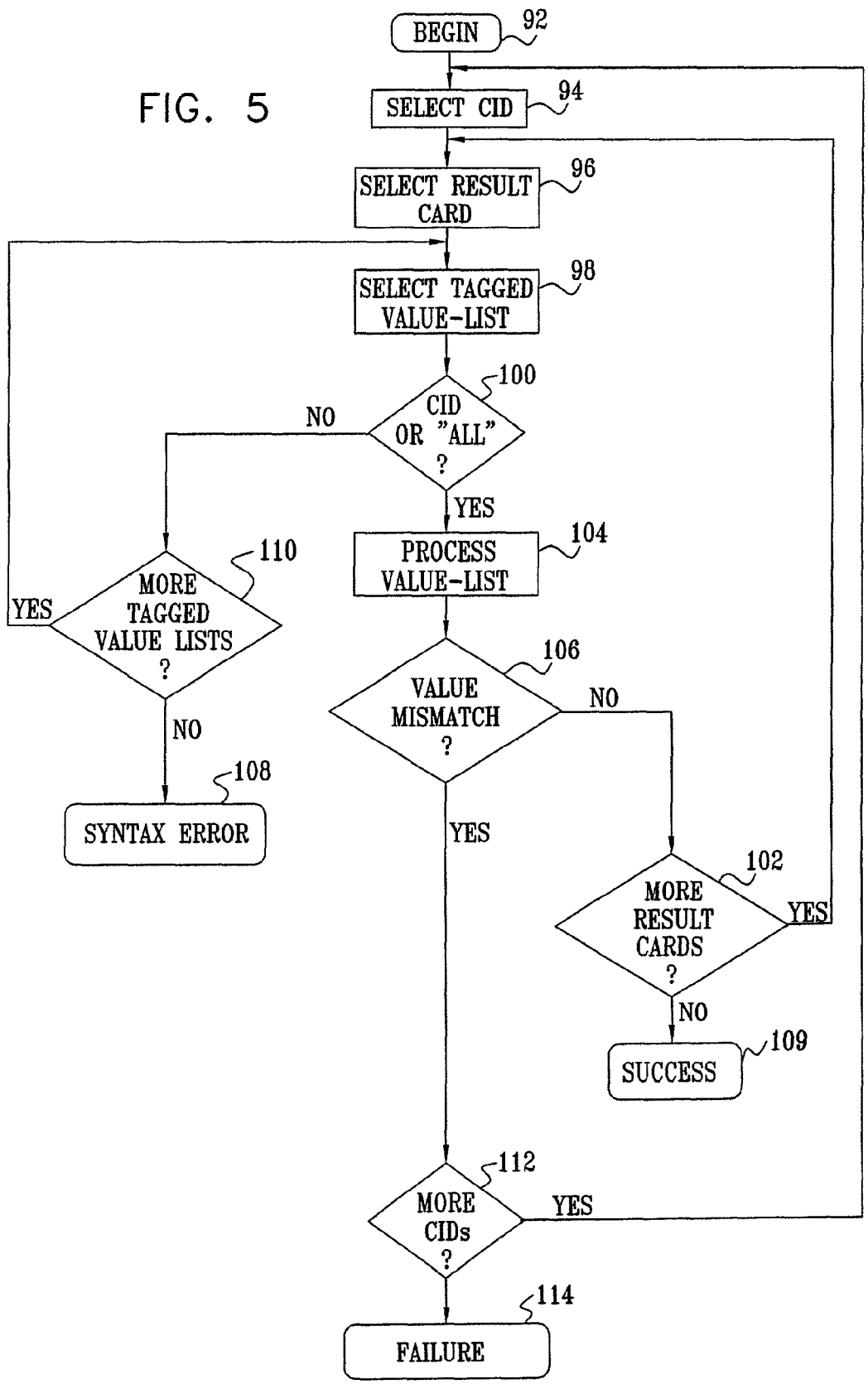
FIG. 5 is a flow diagram of a method of result evaluation in test generation in accordance with an alternate embodiment of the invention that is adapted to tests having general resource dependencies.

Reference is now made to FIG. 5, which is a flow diagram of a method of result evaluation in accordance with an alternate embodiment of the invention that embodies the procedure outlined in Listing 7. This embodiment is capable of detecting design flaws involving general resource dependencies.

The method of FIG. 5, is adapted to processing result cards of the results section 42 (FIG. 2) that have the forms
RESULT <resource-id, set of tagged value-lists>,
The process begins at initial step 92, in which a portion of the method shown in FIG. 3 is performed. Initial step 46, step 48, step 50, step 52, and decision step 54 are performed as disclosed hereinabove. The description of these steps is not repeated in the interest of brevity. Control then passes to step 94.

At step 94 a combination identifier is selected from the combination identifiers that are in the result cards found in the results section 42 (FIG. 2).

Next, at step 96 a result card is selected from list of results found in the results section 42.

Next, at step 98 a tagged value-list is selected from the result card chosen at step 96. Control then passes to decision step 100.

At decision step 100 a determination is made whether the tagged value-list that was selected in step 98 contains either the combination identifier that was selected in step 94 or the special identifier ALL.

If the determination at decision step 100 is affirmative, then control proceeds to step 104, which is disclosed below.

If the determination at decision step 100 is negative, then control passes to decision step 110, where a determination is made whether more members of the set of tagged value-lists in the current result card remain to be evaluated.

If the determination at decision step 110 is affirmative, then control returns to step 98.

If the determination at decision step 110 is negative, then a syntax error in the results section has been detected. Every result card should have a tagged value-list corresponding to the current combination identifier or the special value ALL, which was selected in step 94. Control proceeds to final step 108, and the procedure terminates.

If the determination at decision step 100 is affirmative, then control proceeds to step 104. Here the value-list of the tagged value list that was identified in step 96 is processed generally according to the method disclosed above with reference to FIG. 3 and FIG. 4, the details of which are not repeated for reasons of brevity. The result of this processing is passed to decision step 106.

At decision step 106, it is determined whether a value mismatch was detected respecting the resource identified in the value-list that was processed in step 104.

If the determination at decision step 106 is affirmative, then a failed combination has been detected. Control proceeds to decision step 112, which is disclosed below.

If the determination at decision step 106 is negative, then control proceeds to decision step 102, where a determination is made whether there are more result cards to be evaluated.

If the determination at decision step 102 is affirmative, then control returns to step 96.

If the determination at decision step 102 is negative, then control proceeds to final step 109, where the procedure terminates successfully. No architectural violation has been detected.

Decision step 112 is performed if the determination at decision step 106 was affirmative. It is determined if there are more combination identifiers in the results section remaining to be processed.

If the determination at decision step 112 is affirmative, then control returns to step 94.

If the determination at decision step 112 is negative, then control proceeds to final step 114. The procedure terminates in failure, as no matches have been found in the tagged value-lists with the identified resource.

Automatic Test Generation—Non-Unique Results.

Referring again to FIG. 1, the following section describes ways that a test generator can automatically generate tests that include non-unique results in accordance with a preferred embodiment of the invention.

Prediction of Non-Unique Results—Introduction.

As explained above the test generator engine 24 and the behavioral simulator 28 cooperate to predict the resource results in accordance with the design specification of the multiprocessor 16. In order for the behavioral simulator 28 to be able to predict non-unique results for resources in the scenarios of the examples described above, it must have knowledge of the semantics of the instructions that it may be required to simulate.

In a preferred embodiment of the invention, test generation is performed in a dynamic mode, in which test instructions are simulated while the test is being generated. Initial values for resources that are used for the first time by a simulated instruction must be communicated to the behavioral simulator 28 before the instruction is simulated. These initial values later form the initialization section 38 (FIG. 2) of the test.

At any time during generation, the test generator engine 24 may be informed of the currently predicted state of the resources by the behavioral simulator 28. The test generator engine 24 may be influenced by this information in the generation of subsequent test instructions.

The applications programming interface (API) of the architectural model 14 includes a number of specialized procedures and functions, which are, used in communications between the test generator engine 24 and the behavioral simulator 28.

The procedure,

Initialize-Resource (resource-id, value)

tells the behavioral simulator 28 to set the resource identified as "resource-id" with the initial value "value".

The procedure

Simulate (process-id)

instructs the behavioral simulator 28 to simulate the execution of a single instruction that is pointed to by the program counter of the process specified by the named process-id. This simulation includes recording the relevant pre-execution resource values, and making any changes of the resource values, taking into consideration the semantics of the instruction according to the design specification.

The function value-set Read-Resource (resource-id)

returns all non-unique values allowed by the architecture for the named resource as a set of values. This function is ultimately used by the test generator engine 24 in order to produce the results section of the test.

The function value-set View-Resource (process-id, resource-id)

returns those non-unique values that can be observed in the named resource by the named process. This function is used by the behavioral simulator 28 while it is executing the Simulate function defined above. The View-Resource function is used to determine the values of the input resources of the simulated instruction.

The differences between the functions Read-Resource (resource-id) and View-Resource (process-id, resource-id) can be appreciated by further consideration of the example of read-write collision given in Listing 3, with reference to FIG. 1.

Assume that the test generator engine 24 first calls the procedure Simulate (process 1) in order to simulate the store instruction and then calls the procedure Simulate (process 2) to simulate the load instruction. From the perspective of the test generator engine 24, the only possible result in address 1000 is the value 1. This is independent of the order in which the store and load would occur when the test is later run against the design. When the test is simulated later by the design simulator 32 (FIG. 1), no matter which of the load or store take place first, the result in the address 1000 is 1. This is because the test shown in Listing 3 includes a store of 1 into the address 1000. There is no other store instruction in the test that can change this value.

However, from the perspective of process 2, both of the values 0 and 1 are possible results in the address 1000. Thus, in the test of Listing 3, the value of the R1 register of process 2, which originated from this load, is either 0 or 1.

If the design executes the load before the store then the load would view 0. If the store would come first then the load would view 1.

Thus after the procedure Simulate (process-id) has been called for both instructions the function call Read-Resource (1000) should return the value set {1} and the function call View-Resource (process 2, 1000) should return the value set {0, 1}.

Predictions of Non-Unique Results—Undefined Behavior.

According to the teachings of the invention, automatic test generation can be employed to predict non-unique results when behavior upon execution of an instruction is undefined or not fully specified by the architecture. The behavioral simulator 28 maintains a store RESOURCE-VALUES-STORE. This contains all valid non-unique values for every resource used for all simulated instructions in the test. The search key for this store is resource-id. Each record of the store contains an entry RESOURCE-VALUES that is a set of values. The architectural model 14 also utilizes several procedures as follows.

A resource is initialized using the functions
Initialize-Resource (resource, value)
RESOURCE-VALUE-STORE<resource>=value.
An instruction of a process is simulated using the function
Simulate (process-id).

The instruction for the simulation is pointed to by the program counter of the named process-id as it appears in the store RESOURCE-VALUE-STORE.

Figure 6:
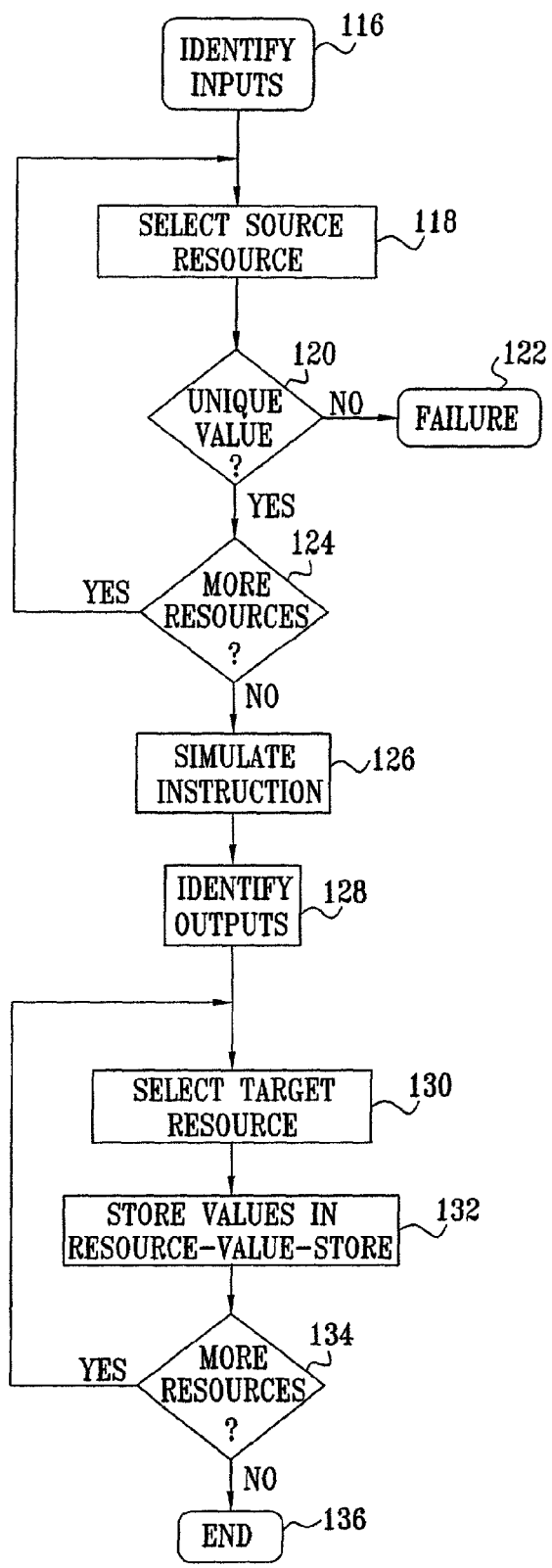
FIG. 6 is a detailed flow diagram illustrating the simulation of an instruction of a process in the method shown in FIG. 5.

Reference is now made to FIG. 6, which is a flow diagram illustrating the details of the simulation of an instruction of a process.

In initial step 116, an instruction is analyzed. All resources that are used as a source for the instruction that was simulated in initial step 116 according to the design specification are now identified.

A source resource is selected at step 118. Control now passes to decision step 120.

At decision step 120 the function
View-Resource (process, resource)
is called. A determination is made whether the function returns a unique value.

If the determination at decision step 120 is negative, then control proceeds to final step 122. It is concluded that an error has occurred and the procedure terminates.

If the determination at decision step 120 is affirmative, then control proceeds to decision step 124, where a determination is made whether more resources are used as a source for the instruction that was analyzed in initial step 116.

If the determination at decision step 124 is affirmative, then control returns to step 118.

If the determination at decision step 124 is negative, then all the source resources have been evaluated.

Control now proceeds to step 126, where the instruction is simulated. All possible values v resulting from the execution of the instruction are analyzed. The possible values for each target resource could be a single value, or a set of values. The latter is likely if the design specification does not precisely stipulate the instruction's behavior.

The target resources of the instruction that was analyzed in step 126 will now each be examined, and possible values of these target resource calculated according to the instruction's semantics.

At step 128 the instruction is analyzed with reference to the values of the source resources that have just been evaluated. The target resources (outputs) of the instruction are identified at this stage. All possible values resulting from the execution of the instruction are calculated. The possible values for each target resource could be a single value, or a set of values. The latter is likely if the design specification does not precisely stipulate the instruction's behavior.

At step 130, a target resource of the instruction that was identified in step 128 is chosen.

Next, at step 132, the values v that were calculated in step 128 are memorized in the store RESOURCE-VALUE-STORE, using the assignment
RESOURCE-VALUE-STORE<resource>=v.

Control now passes to decision step 134, where a determination is made whether more target resources of the instruction that was simulated in step 128 remain to be memorized.

If the determination at decision step 134 is affirmative, then control returns to step 130.

If the determination at decision step 134 is negative, then control proceeds to final step 136, where the procedure terminates.

Predictions of Non-Unique Results—Write-Write Collision.

The following disclosure of a technique of predicting non-unique results in a test program according to the teachings of the invention should be read in conjunction with the foregoing discussion of predicting non-unique results due to undefined behavior, and with FIG. 1.

The entry RESOURCE-VALUES is provided with the following fields: the field INIT_VALUE, which contains the initial-value of the resource, and the field WRITTEN-VALUES<process-id>, which is a list of value-sets for each process that is referenced by the identifier process-id. This list holds the sequences of values written by the process to the resource. Every entry in the list is required to be a set of values, since the written value may be non-unique.

The following procedures are needed by the behavioral simulator 28. They are identical to those disclosed above with reference to the above discussion of prediction of non-unique results, due to undefined behavior:
Initialize-Resource (resource, value).
The implementation is
RESOURCE-VALUE-STORE<resource>=value.
Another procedure is Simulate (process-id), the implementation of which follows.

It will be recalled from the disclosure of step 126 (FIG. 6) that a set of values v is obtained for each resource during the operation of the procedure Simulate (process-id). For each resource "resource", the values v are memorized, (step 132; FIG. 6) using the procedure
RESOURCE-VALUE-STORE<resource>.WRITTEN-
    VALUES<process>=RESOURCE-VALUE-
    STORE<resource>.WRITTEN-VALUES<process>,v
in which the parameter "process" has the value process-id. The values v are now added to the set of values held in the field WRITTEN-VALUES.

It is possible for the simulate method to inform itself of values that can be observed in a resource by a process, using the procedure
value-set View-Resource (process, resource).

The simulate method can consider the values written by any other process. It can also view the last value that the process itself wrote to the resource, or the resource's initial value if the process made no such write. Which value would actually be viewed when a test program executes and is evaluated against the design specification is determined by relative process speeds and various micro-architectural considerations.

Figure 7:
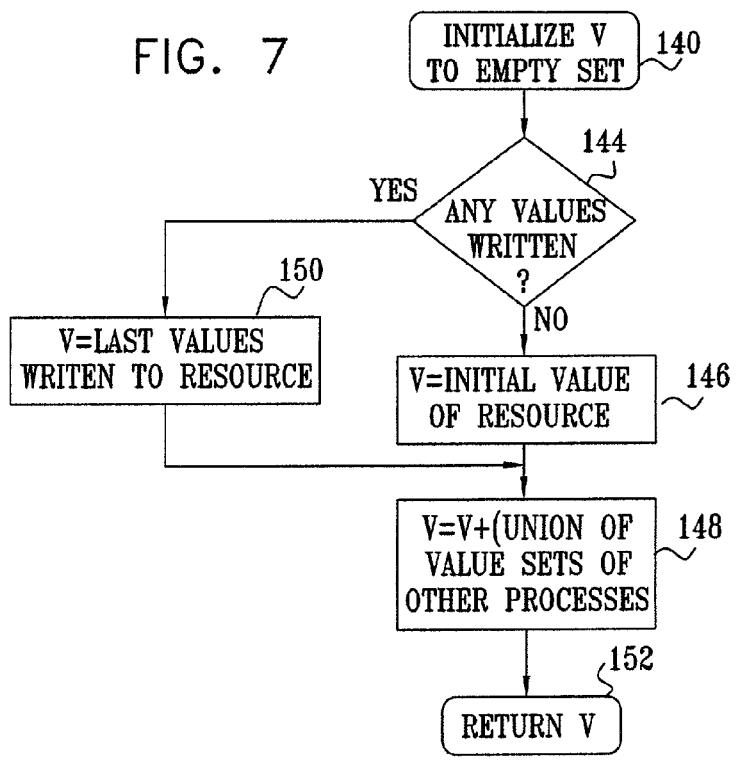
FIG. 7 is a flow diagram illustrating a procedure by which a process can determine the last values written to a resource by all processes in accordance with a preferred embodiment of the invention.

Reference is now made to FIG. 7, which is a flow diagram illustrating a procedure by which a process can determine the value that can be observed in a resource by all processes in accordance with a preferred embodiment of the invention.

At initial step 140. A set v is initialized to the empty set.

Next, at decision step 144 a determination is made if the process wrote any values to the resource. This is done by examining the set returned by the call RESOURCE-VALUE-STORE<resource>.WRITTEN-VALUES<process>.

A determination is made whether this set is empty.

If the determination at decision step 144 is negative, then at step 146 the set v is assigned the initial values of the resource according to the procedure v=RESOURCE-VALUE-STORE<resource>.INIT_VALUE.

Control passes to step 148.

If the determination at decision step 144 is affirmative, then at step 150 v is assigned the last value written by the process. This value can be identified by its order in the WRITTEN-VALUES field, and can be a set of values. Control passes to step 148.

At step 148 the set v is added to the union of all such sets associated with other processes, not including the current process "process", and pertaining to the particular resource "resource". This union can be found in a field RESOURCE-VALUE-STORE<resource>.WRITTEN-VALUES<process'> for every process tag that is not equal to the process "process".

Control now passes to final step 152 where the set v is returned.

The final values of a resource may be any of the last values written to it by the different processes. If no process wrote to the resource then its final value equals its initial value. The value set of last values is obtained by the function value-set Read-Resource (resource).

Figure 8:
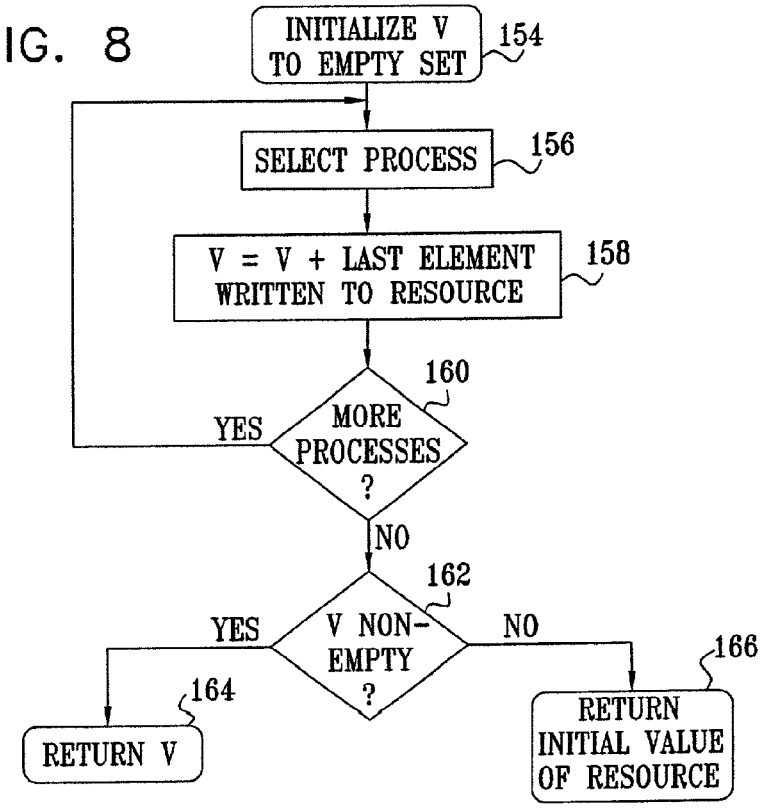
FIG. 8 is a flow diagram illustrating a method of obtaining a value set that contains the last values written to a resource by a plurality of processes in accordance with a preferred embodiment of the invention.

Reference is now made to FIG. 8, which is a flow diagram illustrating a method of obtaining a value set that contains the last values written to a resource by a plurality of processes in accordance with a preferred embodiment of the invention. If no process wrote to the resource, then its final value is the same as its initial value.

The process begins at initial step 154, where a simulation is conducted as described above. The details are not repeated in the interest of brevity. A set v is initialized to the empty set.

Next at step 156 a process is selected. Control then proceeds to step 158, where v is calculated as a union of its current value and the set that appears as the last element of the store entry RESOURCE-VALUE-STORE<resource>.WRITTEN-VALUES process>, where the parameter "resource" is the resource under consideration, and the parameter "process" is the process that was selected in step 156. The field WRITTEN-VALUE contains the last value written to the resource by the process, and may be a value set, as explained above. Control now passes to decision step 160.

At decision step 160, a test is made to determine if there are more processes to evaluate.

If the determination at decision step 160 is affirmative, then control returns to step 156.

If the determination at decision step 160 is negative, then control proceeds to decision step 162, where a determination is made if the set v is non-empty.

If the determination at decision step 162 is affirmative, then control proceeds to final step 164. The set v now contains the last values written to the resources by all processes, and is returned.

If the determination at decision step 162 is negative, then control proceeds to final step 166. The set v is calculated and returned as the initial value of the resource, using the function RESOURCE-VALUE-STORE<resource>.
INIT_VALUE.

Predictions of Non-Unique Results Due to Propagation.

The simulation techniques presented in the foregoing discussion of predicting non-unique results do not allow using a resource with an unknown value as a source for an instruction. These techniques are not useful in the generation of tests involving propagation of non-unique values, such as the example of Listing 4.

With some limitations, the teachings of the inventions permit generation of scenarios that include propagation. In the disclosure that follows, it is assumed that the identity of the resources into which the non-unique values propagate will remain the same for all the values being propagated.

To further appreciate the significance of this requirement, it will be helpful to consider the instruction, "store R1->(R2)" where the value of register R1 is stored in a memory location, the address of which is taken from register R2. Propagation is allowed when register R1 has a non-unique content, but is not allowed when register R2 has non unique contents. This is because the identity of the stored location changes when the value of register R2 varies.

The following two techniques are disclosed with reference to FIG. 1, and the foregoing discussion of. In both of the techniques the procedure Simulate( ) updates the store RESOURCE-VALUE-STORE, which has been explained above, as to resources that become non-unique as a result of propagation of non-unique results in the executed instruction.

Semantic Propagation Simulation.

The procedure Simulate( ) is performed as required by specific semantics of the instruction being simulated by the generator engine 24 (FIG. 1). Knowledge of the semantics is exploited the procedure Simulate( ) to calculate propagation and update the store RESOURCE-VALUE-STORE accordingly.

Referring again to Listing 3, it is understood that procedure Simulate( ) is simulating the load instruction. The entry for address 1000 should show that process 2 in the store RESOURCE-VALUE-STORE can view two values, 0 and 1. Since the simulator recognizes this instruction to be a load instruction from memory 1000 to register R1, the procedure Simulate( ) updates the store RESOURCE-VALUE-STORE. So that the register R1 also holds these two values as the first element in the field WRITTEN-VALUES<process 2>.

Generic Propagation Simulation.

A drawback of the semantic propagation approach is that code for dealing with propagation of non-unique results needs to be written separately for each instruction type, according to its particular semantics.

A generic approach to simulating propagation of non-unique results is as follows:

The procedure Simulate( ) is implemented, using the API of the behavioral simulator 28 as follows: Simulate (process-id, &read-resources, &written-sources), where the operator "&" gives the address of an object. The objects read-resources and written-resources each contains a list of resource-id values of resources which were used as source and target resources of the simulated instruction.

Again, since the procedure Simulate( ) is informed of the semantics of the instruction that is being simulated, sufficient information is provided to enable it to return lists of resource-id values.

The API of the behavioral simulator 28 includes two procedures that provide rollback capability.

snapshot-id SetSnaphot( ), and
Rollback (snapshot-id).

Using these procedures, the behavioral simulator 28 can return to the state in which it was found at the time the procedure SetSnapshot( ) was called, returning the object snapshot-id.

A new method is added to the API of the behavioral simulator 28:

Execute-With-Propagation (process).

This method iteratively simulates the instruction for every possible combination of values in its list of resource-id values found in its associated object read-resources. Each iteration of the simulation results in potentially different values being written to the object written-resource. The values found in the objects read-resources, written-resource are accumulated in the store RESOURCE-VALUES-STORE.

Figure 9:
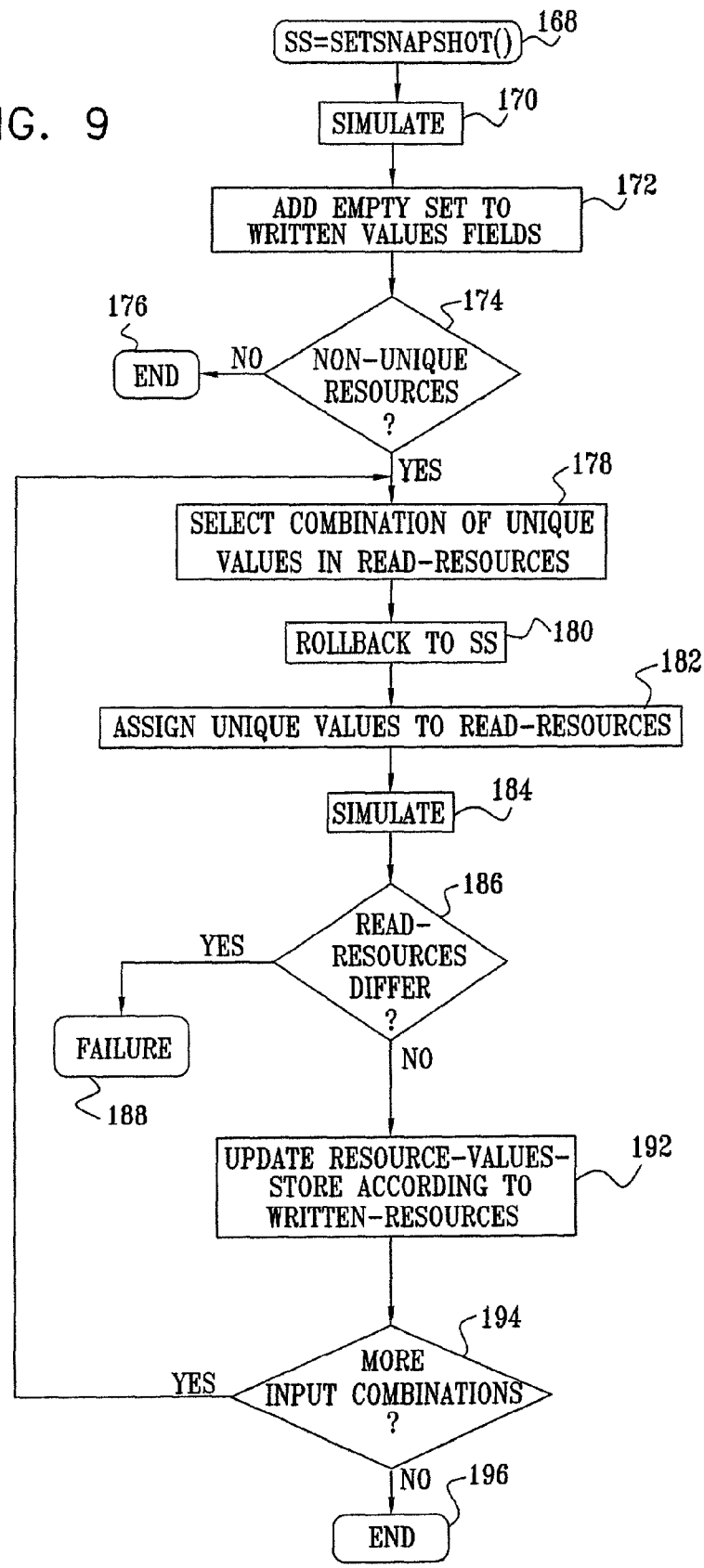
FIG. 9 is a flow diagram illustrating a method of predicting non-unique results in test generation, wherein certain forms of generic propagation of non-unique results can occur among resources.

Reference is now made to FIG. 9, which illustrates a method of predicting non-unique results in automatic test generation, wherein certain forms of generic propagation of non-unique results can occur.

The method begins at initial step 168. Here the state of the architectural model 14 is captured as an object of type snapshot-id, using the call:

ss=Set Snapshot( ).

Next, at step 170 an instruction is simulated as explained above, using the procedure.

Simulate (process, read-resources, written-resources).

Control now passes to step 172, where the empty set is added as a place-holder to the fields WRITTEN-VALUES-FIELDS for every resource and for every process. All the possible written values will eventually be accumulated in the newly added sets. Addition of the empty set is illustrated by the pseudocode fragment of Listing 8.

Listing 8

For every resource "resource" in "written-resources"
  For every process "process"
    RESOURCE-VALUE-STORE<resource>.WRITTEN-VALUES<process>=
    RESOURCE-VALUE-STORE<resource>.WRITTEN-VALUES<process>.empty-set Control now passes to decision step 174, where a test is made whether the function View-Resource (process-id, resource-id) reveals that some resources on the list in the object read-resources are non-unique.

If the determination at decision step 174 is negative, then no further action is required, and the procedure ends at final step 176.

If the determination at decision step 174 is affirmative, then the procedure described in the pseudocode fragment in Listing 9 is to be performed. Control passes to step 178.

Listing 9

For every possible combination of assignments of unique values to read-resources do {
  RollBack (ss)
  Assign the unique values of the combination to the read resources using the Write-Resource method
  Execute (process, read-resources-A, written-resources-A)
  if read-resources-A differs from read-resources or written-resources-A differs from written-resources then fail.
  For every resource in written-resources, get the value just written and add it to the top item in the corresponding entry in
    RESOURCE-VALUE-STORE<resource>.WRITTEN-VALUES<process>.
}

At step 178, a legal combination of resources and processes is selected. This can be done in a simple nested loop in the manner shown in Listing 8.

Next, at step 180 the state of the architectural model 14 is reset to the state according to the object ss that was obtained in initial step 168.

Next, at step 182 the unique values of the combination selected in step 178 are assigned to the value-list contained in the object read-resources that is associated with the combination.

Control now passes to step 184, where, using as parameters the process of the combination selected in step 178, and the addresses of alternate objects read-resources-A, and written-resources-A, the procedure Simulate (process-id, &read-resources, &written-resources) is performed.

Next, the assumption is tested that the identity of the resources into which propagation of non-unique values is occurring remains the same for all the propagated values. Control passes to decision step 186, where a determination is made whether the object read-resources that was set in step 170, differs from the object read-resources-A for the combination of step 184.

If the determination at decision step 186 is affirmative, then it is concluded that the identity of the resource into which propagation is occurring has changed its identity. The scenario is therefore not suitable for this technique of predicting non-unique results, and the procedure fails at final step 188.

If the determination at decision step 186 is negative, then all the values just written to resources listed in the object written-resources for the process of the combination selected in step 178 are placed into the corresponding top items in the store RESOURCE-VALUE-STORE. Control passes to step 192.

At step 192 the store RESOURCE-VALUES-STORE is updated according to the resources listed in the object written-resources, using the method:

RESOURCE-VALUE-STORE<resource>.WRITTEN VALUES<process>.

Control now passes to decision step 194, where a determination is made if more combinations remain to be processed.

If the determination at decision step 194 is affirmative, then control returns to step 178.

If the determination at decision step 194 is negative, then control proceeds to final step 196, and the procedure ends successfully.

Limiting Propagation.

Allowing propagation of non-unique values in some scenarios is sometimes important in verifying a design specification. However, in general costs are incurred. Space is required for the store RESOURCE-VALUES-STORE. The procedure Simulate( ) consumes time, and the precision of the test results can be compromised, if the dependencies are not well reported. Therefore, it is desirable to limit propagation of non-unique values to those cases where there are clear verification benefits.

The following guidance has been found to be helpful. It is advised not to propagate non-unique values into the program counter. When using the semantic propagation approach, some instructions may be difficult to simulate, or can be costly in terms of execution time or storage space if exact results are demanded. These situations can be avoided by the test generator. Furthermore, there should be no propagation where the identity of the resources being propagated into will remain the same for all the propagated values. It is the responsibility of the test generator to conform to these rules.

The Store-After-Load Problem.

For an appreciation of the store-after-load problem in test generation, reference is again made to the example of Listing 3 and FIG. 1. In one case, the test generator engine 24 may first generate the store operation "store R1->3000". Assume that the propagation of the non-unique values {0, 1} is not limited, and the test generator engine 24 proceeds to generate the instruction "load 3000->R1". One of the non-unique values {0, 1} is then be loaded into the register R1. It is now invalid for the generator to generate a conditional branch instruction (branch-conditional) for process 2, in which the condition depends on R1. To do so would violate the guideline against propagating non-unique values into the program counter.

On the other hand, if the test generator engine 24 first generates the load instruction "load 3000->R1". At this point, from the perspective of the test generator engine 24, the register R1 has the unique value 0. The test generator engine 24 can then safely generate a branch-conditional instruction that depends on the register R1, since now there is no non-unique value propagating from the register R1 to the program counter. Later the test generator engine 24 generator generates the store instruction "store R1->3000". Now, after the store has been generated it turns out that the branch-conditional instruction was actually invalid, in which case a non-unique program counter results.

From consideration of two foregoing cases, in order to deal with a store-load collision leading to non-unique results, the load instruction should be generated after the store instruction, and not vice-versa.

Biasing Generation for Scenarios Causing Non-Unique Results.

As has been disclosed hereinabove, many interesting scenarios to verify multi process designs involve tests with non-unique results. It is often desirable to bias random test generation towards such test scenarios. For example, when the test generator needs to choose an address for a store instruction it can search for possibilities that cause the store instruction to collide with a store instruction of another process. Preferably, the user is afforded control of the level of the bias, the closeness in space and time of the colliding addresses, and the collision patterns, for example star patterns in which a central process collides with other processes, a clique pattern in which any process can collide with any other process, local collisions involving one processor, and non-local collisions. The generator must conform to the guidelines given above for limiting propagation and avoiding the store-after-load problem.

Test Phases.

If a test includes a long list of instructions for each process then the following considerations arise. The closer in time collisions occur, the greater challenge they present in the verification of the design specification. However, with long sequences of instructions being executed by multiple processes, the likelihood that accesses actually occur close in time when the test is run is relatively small, even in the case that two processes execute instructions that access the same memory location. Furthermore, as the length of the instruction sequence increases for one process, greater limitations are imposed on other processes in order that they can limit undesired propagation of non-unique values and avoids the store-after-load problem.

The quality of the test improves, if from time to time barriers are created, so that all the processes synchronize among themselves. The test section between two such global synchronization points is termed a "phase". Short phases increase the likelihood that collisions occur more closely in time. A further benefit of short phases is relaxation of limitations related to limiting propagation and the store-after-load problem.

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art which would occur to persons skilled in the art upon reading the foregoing description.

What is claimed is:

1. A computer software product, comprising a computer-readable non-transitory medium in which computer program instructions are stored, which instructions, when read by a computer, cause the computer to execute a method for validating a multi-processor design by simulating program execution, comprising the steps of:

identifying a plurality of mutually dependent non-adjacent resources having non-contiguous addresses accessed by a multi-processor architecture test program that includes a first simulated process and a second simulated process, wherein each of the mutually dependent non-adjacent resources has an adjacent resource at a contiguous address therewith;

identifying a set of value-lists, each value-list comprising a list of elements, wherein each of the elements corresponds respectively to a permissible value of one of the mutually dependent non-adjacent resources and to a permissible value of the adjacent resource thereof;

associating a set of non-unique values for said mutually dependent non-adjacent resources;

initializing said mutually dependent non-adjacent resources;

using said initialized mutually dependent non-adjacent resources executing said test program by the steps of:

executing a first sequence of instructions in said first simulated process; and while performing said step of executing said first sequence, executing a second sequence of instructions in said second simulated process;

wherein each of said mutually dependent non-adjacent resources is accessed by at least one of said first simulated process and said second simulated process, and wherein upon completion of said steps of executing said first sequence and executing said second sequence, a member of said set of non-unique values is required to be present in each of said mutually dependent non-adjacent resources and in said adjacent resource thereof;

creating, by the computer executing said test program, a set of tagged value-lists, each tagged value-list identifying an allowed subcombination of values of one of the mutually dependent non-adjacent resources and the adjacent resource thereof resulting from the steps of executing said first sequence and said second sequence, and formed by tagging members of a list of predicted results with a combination identifier which includes a string of literals identifying a particular outcome of said test program, wherein at least a portion of said mutually dependent non-adjacent resources have a common combination identifier, each of said tagged value-lists comprising:
   said list of elements; and
   said combination identifier;
   upon completion of an execution of said first sequence and said second sequence comparing contents of said mutually dependent non-adjacent resources and said adjacent resource thereof with a corresponding member of said set of tagged value-lists to match the allowed subcombination of values thereof, said step of comparing performed by selecting commonly tagged members of said set of tagged value-lists for each said combination identifier; and
   responsively to a failure to match any allowed subcombination of values in iterations of said step of comparing reporting that an architectural violation of the multiprocessor design exists.

2. The computer software product according to claim 1, wherein said resource is a memory resource.

3. The computer software product according to claim 1, wherein said resource is a register.

4. The computer software product according to claim 1, wherein said set of non-unique values is said set of value-lists.

5. The computer software product according to claim 4, wherein said adjacent resource comprises a first adjacent resource and a second adjacent resource having a contiguous address with the first adjacent resource, and each member of said set of value-lists comprises a first value and a second value, said first value being a permissible value of said first adjacent resource, and said second value being a permissible value of said second adjacent resource, and said step of verifying further comprising the steps of:
   identifying a valid member of said set of value-lists, by the steps of:
      verifying an equality between a content of said first adjacent resource and said first value of said valid member; and
      verifying an equality between a content of said second adjacent resource and said second value of said valid member.

6. The computer software product according to claim 1, wherein said mutually dependent non-adjacent resources comprise a first resource and a second resource and said set of non-unique values comprises a first set of non-unique values that is associated with said first resource, and a second set of non-unique values that is associated with said second resource, the method further comprising the steps of:
   associating a first member of said first set of non-unique values with a second member of said second set of non-unique values;
   verifying a first equality between said first resource and said first member; and
   verifying a second equality between said second resource and said second member.

7. The computer software product according to claim 6, wherein said step of associating said first member is performed by tagging said first member and said second member with a common combination identifier of the particular outcome of said test program.

8. The computer software product according to claim 6, wherein said first member of said first set of non-unique values comprises a first list of values, and said second member of said second set of non-unique values comprises a second list of values, respective elements of said first list of values being permissible values of said first resource and adjacent resources having contiguous addresses thereof, and respective elements of said second list of values being permissible values of said second resource and adjacent resources having contiguous addresses thereof, wherein said step of verifying a first equality comprises of verifying an equality between a content of said first resource and adjacent resources thereof with corresponding elements of said first list of values; and
   verifying a second equality comprises verifying an equality between a content of said second resource and adjacent resources thereof with corresponding elements of said second list of values.

9. The computer software product according to claim 1, wherein said step of associating said mutually dependent non-adjacent resources with said set of non-unique values is performed prior to said step of executing said first sequence of instructions.

10. The computer software product according to claim 9, wherein said step of associating said mutually dependent non-adjacent resources with said set of non-unique values is performed by the steps of:
   defining a results section in input statements, and entering all permissible values assumable by said mutually dependent non-adjacent resources and an identifier of said mutually dependent non-adjacent resources in respective entries of said results section.

11. The computer software product according to claim 1, wherein said step of executing said test program further comprises the steps of:
   generating said first sequence and said second sequence to define generated instructions;
   simulating one of said generated instructions in said first simulated process and said second simulated process;
   maintaining a store that contains a set of values that are assumable in said resource during said step of simulating said one of said generated instructions; and
   thereafter determining whether said store contains non-unique values.

12. The computer software product according to claim 11, wherein said step of maintaining said store further comprises the steps of:
   maintaining a first store that contains first values contained in said resource during accesses thereof by said first simulated process; and
   maintaining a second store that contains second values contained in said resource by said second simulated process during accesses thereof, wherein said first values comprise first read values and first written values, and said second values comprise second read values and second written values; and
   said step of determining whether said store contains non-unique values further comprises the step of identifying in one of said first store and said second store a last value written to said resource in said step of simulating said one of said generated instructions.

13. The computer software product according to claim 1, further comprising the step of establishing a synchronization barrier for said first simulated process and said second simulated process.

14. The computer software product according to claim 1, further comprising the step of biasing generation of said test program to promote collisions of memory accessing instructions that are executed by said first simulated process and said second simulated process.

15. A computer software product, comprising a computer-readable medium in which computer program instructions are stored, which instructions, when read by a computer, cause the computer to perform a method of verification of a multi-processor architecture by simulation, comprising the steps of:

defining a program input to a test generator;

generating a multi-processor architecture test program responsive to said program input, said test program including a list of resource initializations, a list of instructions, and a list of predicted resource results comprising a plurality of mutually dependent non-adjacent resources having non-contiguous addresses, wherein at least one member of said list of predicted resource results comprises a value-list containing permissible values of one of said mutually dependent non-adjacent resources;

initializing said mutually dependent non-adjacent resources;

using said initialized mutually dependent non-adjacent resources simulating an execution of said test program using a plurality of simultaneously executing processes;

creating, by the computer executing said test program, a set of tagged value-lists, each tagged value-list comprising said value-list of said at least one member and identifying an allowed subcombination of values of one of the mutually dependent non-adjacent resources resulting from execution said test program, and formed by tagging members of a list of predicted results with a combination identifier which includes a string of literals identifying a particular outcome of said test program, wherein at least a portion of said mutually dependent non-adjacent resources have a common combination identifier, each of said tagged value-lists further comprising said combination identifier;

upon completion of an execution of said processes comparing contents of said mutually dependent non-adjacent resources with the correspondingly tagged member of said set of tagged value-lists to match the allowed subcombination of values thereof, said step of comparing performed by selecting commonly tagged members of said set of tagged value-lists for each said combination identifier; and responsively to a failure to match any allowed subcombination of values in iterations of said step of comparing reporting that an architectural violation of the multi-processor architecture exists.

16. The computer software product according to claim 15, wherein said list of predicted resource results comprises predicted results of adjacent resources having contiguous addresses, wherein said adjacent resources are mutually dependent, and said step of verifying said actual resource result is performed by verifying each of said adjacent resources.

17. The computer software product according to claim 16, wherein said adjacent resources are memory resources.

18. The computer software product according to claim 16, wherein said adjacent resources are registers.

19. The computer software product according to claim 15, further comprising the step of establishing a synchronization barrier for said simultaneously executing processes.

20. The computer software product according to claim 15, further comprising the steps of biasing generation of said test program to promote collisions of memory accessing instructions that are executed by said simultaneously executing processes.

21. The computer software product according to claim 15, further comprising the steps of:

identifying a combination of said mutually dependent non-adjacent resources by tagging corresponding members of said list of predicted resource results with a unique combination identifier of a particular outcome of said test program so as to define commonly tagged lists of values of predicted resource results; and wherein said step of verifying said actual resource result is performed by verifying that resources of said combination have actual results that are equal to a member of a corresponding one of said commonly tagged lists of values.

22. A computer software product, comprising a computer-readable medium in which computer program instructions are stored, which instructions, when read by a computer, cause the computer to perform a method of predicting non-unique results by simulating a system design, comprising the steps of:

defining a program input to a test generator;

generating a multi-processor architecture test program responsive to said program input, said test program including a list of resource initializations, a list of instructions, and a list of predicted resource results comprising a plurality of mutually dependent non-adjacent resources having non-contiguous addresses, wherein at least one member of said list of predicted resource results comprises a value-list containing permissible values of a resource;

initializing said mutually dependent non-adjacent resources;

using said initialized mutually dependent non-adjacent resources simulating an execution of a single instruction of said test program by a first process of said test program;

calculating possible values of target resources of said single instruction;

creating, by the computer executing said test program, a set of tagged value-lists by tagging members of a list of predicted results with a combination identifier which includes a string of literals identifying a particular outcome of said test program, each said tagged value-list identifying an allowed subcombination of values of one of the mutually dependent non-adjacent resources, wherein at least a portion of said mutually dependent non-adjacent resources have a common combination identifier, comprising:

a list of said permissible values; and said combination identifier; and upon completion of an execution of said single instruction comparing contents of said mutually dependent non-adjacent resources with the correspondingly tagged member of said set of tagged value-lists to match the allowed subcombination of values thereof, said step of comparing performed by selecting commonly tagged members of said set of tagged value-lists for each said combination identifier; and responsively to a failure to match any allowed subcombination of values in iterations of said step of comparing reporting that an architectural violation of the multi-processor architecture exists.

23. The computer software product according to claim 22, the method further comprising the steps of:

performing said step of simulating an execution by a second process of said test program;

maintaining lists of written values that are written to said target resources of said single instruction by said first process and said second process; and determining respective last values in said lists of written values.

24. The computer software product according to claim 23, the method further comprising the steps of:

prior to performing said steps of simulating said execution by said first process and of simulating said execution by said second process memorizing an initial simulated state of said test program;

maintaining lists of read values that are read from source resources of said single instruction;

identifying a member of said lists of read values so as to define an identified member;

restoring said initial simulated state of said test program; and performing said step of simulating said execution a second time, and reading said identified member, using an associated process other than the first and second processes.

25. The computer software product according to claim 1, wherein said mutually dependent non-adjacent resources comprise resources of different types.

26. The computer software product according to claim 25, wherein said different types comprise memories and registers.

27. The computer software product according to claim 15, wherein said non-adjacent resources are memory resources.

28. The computer software product according to claim 15, wherein said non-adjacent resources are registers, and wherein the addresses comprise indexes.

29. The computer software product according to claim 15, wherein said mutually dependent non-adjacent resources comprise resources of different types.

30. The computer software product according to claim 29, wherein said different types comprise memories and registers.

31. The computer software product according to claim 22, wherein said mutually dependent non-adjacent resources comprise resources of different types.

32. The computer software product according to claim 31, wherein said different types comprise memories and registers.

* * * * *